(12) United States Patent
Hughes

(10) Patent No.: US 9,941,740 B2
(45) Date of Patent: *Apr. 10, 2018

(54) SYSTEMS, APPARATUS AND METHODS FOR QUANTIFYING AND IDENTIFYING DIVERSION OF ELECTRICAL ENERGY

(71) Applicant: MBH Consulting Ltd., Coquitlam (CA)

(72) Inventor: Michael Brent Hughes, Coquitlam (CA)

(73) Assignee: MBH CONSULTING LTD., Coquitlam (CA)

( * ) Notice: Subject to any disclaimer, the term of this patent is extended or adjusted under 35 U.S.C. 154(b) by 0 days.

This patent is subject to a terminal disclaimer.

(21) Appl. No.: 15/234,759

(22) Filed: Aug. 11, 2016

(65) Prior Publication Data

US 2016/0352142 A1 Dec. 1, 2016

Related U.S. Application Data

(63) Continuation-in-part of application No. 13/681,321, filed on Nov. 19, 2012, now Pat. No. 9,418,045.

(Continued)

(51) Int. Cl.
*H02J 13/00* (2006.01)
*G06Q 10/06* (2012.01)
(Continued)

(52) U.S. Cl.
CPC ...... *H02J 13/0006* (2013.01); *G01R 21/1331* (2013.01); *G06F 1/28* (2013.01);
(Continued)

(58) Field of Classification Search
None
See application file for complete search history.

(56) References Cited

U.S. PATENT DOCUMENTS 4,419,666 A 12/1983 Gurr et al.
6,369,719 B1 4/2002 Tracy et al.
(Continued)

FOREIGN PATENT DOCUMENTS

CN 101477162 A 7/2009
CN 201322766 Y 10/2009

OTHER PUBLICATIONS

Bandim, C.J; Alves Jr, J.E.R; Pinto Jr., V.; Souza, F.C.; Loureirom M.R.B., Magalhaes, C.A.; Galvez-Durand, F.; Identification of Energy Theft and Tampered Meters Using a Central Observer Meter: A Mathematical Approach; 2003; IEEE; pp. 163-168.*

(Continued)

*Primary Examiner* — Gregory J Toatley
*Assistant Examiner* — Terence Stifter, Jr.
(74) *Attorney, Agent, or Firm* — Norton Rose Fulbright Canada LLP

(57) ABSTRACT

Systems, apparatus and methods for quantifying and identifying diversion of electrical energy are provided. Bypass and tap diversions may be identified in an electric utility power distribution inventory zone having both bypass and tap diversions. Bypass diversion factors for consumer nodes in an inventory zone are determined by finding a solution to a system of load balance equations having slack variables representing aggregate tap loads for the inventory zone and in which consumer load profile data is scaled by the bypass diversion factors, which solution minimizes an objective function whose value is positively related to the sum of the slack variables representing the aggregate tap loads. Tap loads are correlated with nodes in an inventory zone by solving a first system of power flow equations not having variables representing tap loads, and then solving a second system of power flow equations having variables representing tap loads using an iterative numerical solution technique (Continued)

initialized based on the solution to the first system of power flow equations.

25 Claims, 10 Drawing Sheets

Related U.S. Application Data

(60) Provisional application No. 61/569,684, filed on Dec. 12, 2011.

(51) Int. Cl.
| | |
|---|---|
| *G06Q 50/06* | (2012.01) |
| *G06F 1/28* | (2006.01) |
| *G06F 17/30* | (2006.01) |
| *G01R 21/133* | (2006.01) |

(52) U.S. Cl.
CPC ....... *G06F 17/30424* (2013.01); *G06Q 10/06* (2013.01); *G06Q 10/063* (2013.01); *G06Q 50/06* (2013.01); *Y04S 50/00* (2013.01)

(56) References Cited

U.S. PATENT DOCUMENTS

| | | | |
|---|---|---|---|
| 6,633,823 | B2 | 10/2003 | Bartone et al. |
| 7,135,956 | B2 | 11/2006 | Bartone et al. |
| 7,304,587 | B2 | 12/2007 | Boaz |
| 7,539,581 | B2 | 5/2009 | Swarztrauber et al. |
| 7,936,163 | B2 | 5/2011 | Lee, Jr. |
| 7,986,246 | B2 | 7/2011 | Angelis et al. |
| 9,122,618 | B2 | 9/2015 | Hughes |
| 9,418,045 | B2 | 8/2016 | Hughes |
| 2005/0160128 | A1* | 7/2005 | Fardanesh ............. G06F 17/504 708/446 |
| 2007/0033151 | A1 | 2/2007 | Lee, Jr. |
| 2007/0136082 | A1 | 6/2007 | Jackson et al. |
| 2007/0203658 | A1 | 8/2007 | Patel |
| 2008/0109387 | A1* | 5/2008 | Deaver ............ G01R 19/16547 705/412 |
| 2008/0177678 | A1 | 7/2008 | Di Martini et al. |
| 2009/0093916 | A1 | 4/2009 | Parsonnet et al. |
| 2010/0007336 | A1 | 1/2010 | de Buda |
| 2010/0306027 | A1 | 12/2010 | Haugh |
| 2013/0191051 | A1* | 7/2013 | Stocker ................. G01D 4/004 702/59 |

OTHER PUBLICATIONS

International Search Report and Written Opinion dated Feb. 11, 2013, issued in connection with international patent application No. PCT/CA2012/050889.

Author Unknown, "(Generalized) Reduced Gradient Method", Extract from "Primal Methods" Lecture, Georgia Institute of Technology.

Leon S. Lasdon et al., "Nonlinear Optimization Using the Generalized Reduced Gradient Method", NTIS, Oct. 1973.

Ralph W. Pike, "Process Optimization—Mathematical Programming and Optimization of Multi-Plant Operations and Process Design", Lamar University, Apr. 10, 2007.

Sergio Ferreira, "Network efficiency improvements", European Copper Institute, Mar. 2007.

Zeljković, C. and Gaćanović, M., "An example of using Microsoft Excel Solver for power network calculations", Accessed: Oct. 4, 2011, Online available: http://phd.etfbl.net/files/Works_PDF/Zeljkovic%20Cedomir.pdf.

"Achieving high performance with theft analytics—Leveraging smart grid deployments to enhance revenue protection", Accenture, 2011.

EPO Examiner's Report dated Aug. 24, 2017, issued in connection with related European patent application No. 12858467.9.

Kadurek, P. et al., "Theft detection and smart metering practices and expectations in the Netherlands", Innovative Smart Grid Technologies Conference Europe (ISGT Europe), 2010 IEEE PES, IEEE, Piscataway, NJ, USA, Oct. 11, 2010, pp. 1-6.

McCullough, Jeff, "Deterrent and detection of smart grid meter tampering and theft of electricity, water, or gas", Dec. 31, 2010, retrieved from the Internet: URL: http://www-elstersolutions-com.dyn.elster.com/assets/downloads/WP42-1010A.pdf.

Depuru SSSR et al., "Electricity theft: Overview, issues, prevention and a smart meter based approach to control theft", Energy Policy, Elsevier, Amsterdam, NL, vol. 39, No. 2, Feb. 1, 2011, pp. 1007-1015.

* cited by examiner

SYSTEMS, APPARATUS AND METHODS FOR QUANTIFYING AND IDENTIFYING DIVERSION OF ELECTRICAL ENERGY

CROSS REFERENCE TO RELATED APPLICATIONS

This application is a continuation in part of U.S. patent application Ser. No. 13/681,321, which claims the benefit of priority of U.S. Provisional Patent Application No. 61/569,684 filed on Dec. 12, 2011. The subject matter of this application is related to that of U.S. patent application Ser. No. 13/681,314, (now U.S. Pat. No. 9,122,618), which also claims the benefit of priority of U.S. Provisional Patent Application No. 61/569,684. These applications are hereby incorporated herein by reference in their entirety.

TECHNICAL FIELD

The invention relates to quantifying and identifying sources of diversion of electric energy in electric utility power distribution systems. Particular embodiments provide method and apparatus for identifying sources of diversion of electric energy in electric utility power distribution systems containing both tap and by-pass diversions.

BACKGROUND

Electric utility energy distribution systems are used to distribute electric energy from electric power generation plants to electric energy consumers. FIG. 1 is a schematic diagram of part of an example electric energy distribution system 10. A high voltage primary distribution line 12 provides electric energy to a distribution transformer 14. Distribution transformer 14 is connected to a lower voltage secondary distribution line 16, and steps down the voltage of primary line 12 to the voltage of secondary distribution line 16. Secondary distribution line 16 is connected to a plurality of branches 18A, 18B, and 18C corresponding to different energy consumers 20A, 20B and 20C. The consumption of energy by consumers 20A, 20B and 20C is metered by consumer meters 22A, 22B and 22C provided on branches 18A, 18B and 18C, respectively.

An unfortunate reality of electric utility energy distribution is that electric energy is sometimes unlawfully diverted to avoid metering. The unlawful diversion of electric energy is sometimes referred to in the electric energy industry as electricity theft or non-technical losses. Two common forms of electric energy diversion are bypasses and taps.

In FIG. 1, a bypass 24 provides an electrical path in parallel to meter 22B, such that a portion of the energy consumed by consumer 20B bypasses meter 22B so as not to be accounted for in meter 22B's measurement of electric energy consumption. Because bypass 24 is connected at either side of meter 22B, the amount of electric energy diverted through bypass 24 is related to the amount of electric energy delivered through meter 22B.

FIG. 1 also shows a distribution tap 26. Distribution tap 26 provides an additional electrical path from branch 18C to consumer 20C (e.g., to a separate panel) or to another consumer. Because distribution tap 26 is not connected on both sides of meter 22C, the amount of electric energy diverted through tap 26 is not related to the amount of electric energy delivered through meter 22C.

Because electric energy diversion is costly to electric energy utilities and may be linked to other criminal activity (e.g., clandestine marijuana grow operations), there is a need for quantifying and identifying sources of electric energy diversion. It is possible to quantify electric energy diversion within a particular part of an electric energy distribution network (referred to herein as an "inventory zone") by comparing the energy delivered to the inventory zone with metered energy consumption removed from (i.e., consumed in) the inventory zone. In the context of the distribution system 10, the energy delivered to an inventory zone 28 may be measured by a meter 30 connected in series between distribution transformer 14 and secondary distribution line 16.

If only bypass diversions are present in an inventory zone, it is possible to identify where bypass diversions are located from the vector k of bypass diversion factors found by measuring energy consumption for the inventory zone and consumers within the inventory zone for a plurality of intervals, and solving the system of linear equations $$\begin{bmatrix} w_{11} & \cdots & w_{1j} \\ \vdots & \ddots & \vdots \\ w_{i1} & \cdots & w_{ij} \end{bmatrix} \begin{bmatrix} k_1 \\ \vdots \\ k_j \end{bmatrix} = \begin{bmatrix} w_{z1} \\ \vdots \\ w_{zi} \end{bmatrix} \quad (1)$$

where:
i is the number of intervals;
j is the number of consumers;
$w_{ij}$ is the energy consumption measured for the $i^{th}$ time interval by the meter for the $j^{th}$ consumer, and
$w_{zi}$ is the energy consumption measured for the $i^{th}$ time interval by the distribution transformer meter for the inventory zone).

For convenience, matrix equality (1) may be expressed as $W_{consumer} k = w_{zone}$ where $W_{consumer}$ is a matrix of metered consumer load profile data $w_{ij}$ for consumers in the inventory zone over a number of time intervals (i.e., $W_{consumer} = [w_{ij}]_{n \times m}$ for m consumers and n time intervals) and $w_{zone}$ is a vector of inventory zone load profile data (i.e. $w_{zone} = [w_{zi}]_m$).

This technique fails if the inventory zone contains one or more tap diversions, since electric energy diverted by way of taps is reflected in inventory zone load profile $w_{zone}$ but is not reflected in the metered consumer load profiles $W_{consumer}$. Currently, bypass diversions and tap diversions are identified by manually inspecting electric power distribution equipment (e.g., transformers, lines, meters, etc.). This is time-consuming and labour intensive.

The inventor has identified a need for methods and apparatus adapted to use metered electric energy consumption data to do one or more of the following:
- quantify bypass diversion loads in an inventory zone that contains bypass diversions and tap diversions,
- reliably identify the locations of bypass diversions in an inventory zone that contains bypass diversions and tap diversions,
- quantify tap diversion loads in an inventory zone that contains bypass diversions and tap diversions, and
- identify the locations of tap diversions in an electric utility power distribution system.

The foregoing examples of the related art and limitations related thereto are intended to be illustrative and not exclusive. Other limitations of the related art will become apparent to those of skill in the art upon a reading of the specification and a study of the drawings.

SUMMARY

The following embodiments and aspects thereof are described and illustrated in conjunction with systems, tools and methods which are meant to be exemplary and illustrative, not limiting in scope. In various embodiments, one or more of the above-described problems have been reduced or eliminated, while other embodiments are directed to other improvements.

An aspect of the invention provides a method for identifying and locating non-technical losses in an electric utility power distribution inventory zone, the inventory zone comprising a plurality of nodes including at least one metered distribution node and at least two metered consumer nodes. In an example embodiment, the method comprises obtaining inventory zone load profile data, obtaining consumer load profile data for the consumer nodes, determining bypass diversion factors for the consumer nodes and aggregate tap loads for the inventory zone that (i) solve a system of load balance equations for the inventory zone having known values corresponding to the inventory zone load profile data and to the consumer load profile data and having slack variables representing the aggregate tap loads, in which the known values corresponding to the consumer load profile data are scaled by the bypass diversion factors and (ii) minimize an objective function whose value is positively related to the sum of the slack variables representing the aggregate tap loads, and identifying a bypass diversion factor of at least two as a bypass theft and locating the bypass theft based on a location of the consumer node corresponding to that bypass diversion factor. In some embodiments, methods according to this aspect additionally comprise obtaining an admittance matrix modeling the electrical admittance between the nodes of the inventory zone, obtaining real and reactive load data for each of the metered nodes of the inventory zone, obtaining voltage magnitude data for each of the metered nodes of the inventory zone, determining a voltage phase angle for each of the consumer nodes that solve a first system of power flow equations for the inventory zone having known values corresponding to the real and reactive load data for the consumer nodes and in which the distribution node is treated as a slack node, determining real and reactive tap loads corresponding to select ones of the consumer nodes that (i) solve a second system of power flow equations for the inventory zone having known values corresponding to the real and reactive load data for each of the metered nodes, voltage magnitude values corresponding to the voltage data each of the metered nodes, and having slack variables representing the real and reactive tap loads, and (ii) minimize an objective function whose value is positively related to at least one of the slack variables representing the real and reactive tap loads using an iterative numerical solution technique wherein variables in the second system of power flow equations corresponding to the voltage phase angles of the select ones of the consumer nodes are initialized to values corresponding to the corresponding determined voltage phase angles that solve the first system of power flow equations, and identifying any of the real and reactive unmetered tap loads having a value exceeding a pre-determined threshold as a tap theft and locating the tap theft based on a location of the corresponding consumer node.

Another aspect of the invention provides a method identifying and locating tap loads in an electric utility power distribution inventory zone, the inventory zone comprising a plurality of nodes including at least one metered distribution node and at least metered two consumer nodes. In some embodiments, the method comprises obtaining an admittance matrix modeling the electrical admittance between the nodes of the inventory zone, obtaining real and reactive load data for each of the metered nodes of the inventory zone, obtaining voltage magnitude data for each of the metered nodes of the inventory zone, determining a voltage phase angle for each of the consumer nodes that solve a first system of power flow equations for the inventory zone having known values corresponding to the real and reactive load data for the consumer nodes and in which the distribution node is treated as a slack node, determining real and reactive unmetered tap loads corresponding to select ones of the consumer nodes that (i) solve a second system of power flow equations for the inventory zone having known values corresponding to the real and reactive load data for each of the nodes, voltage magnitude values corresponding to the voltage data for each of the metered nodes, and having slack variables representing the real and reactive unmetered tap loads, and (ii) minimize an objective function whose value is positively related to at least one of the slack variables representing the real and reactive unmetered tap loads using an iterative numerical solution technique wherein variables in the second system of power flow equations corresponding to the voltage phase angles of the select ones of the consumer nodes are initialized to values corresponding to the corresponding determined voltage phase angles that solve the first system of power flow equations, and identifying any of the real and reactive unmetered tap loads having a value exceeding a pre-determined threshold as a tap theft and locating the tap theft based on a location of the corresponding consumer node.

A further aspect of the invention provides a system for identifying and locating non-technical losses in an electric utility power distribution inventory zone, the inventory zone comprising a plurality of nodes including a distribution node and at least two consumer nodes. In some embodiments, the system comprises a data store comprising a non-transitory computer readable medium containing inventory zone load profile data and consumer load profile data for each of the consumer nodes, and a data processor communicatively coupled to the data store. The data processor may be configured to obtain the inventory zone load profile data from the data store, obtain the consumer load profile data for each of the consumer nodes from the data store, determine bypass diversion factors for the consumer nodes and aggregate tap loads for the inventory zone that (i) solve a system of load balance equations for the inventory zone having known values corresponding to the inventory zone load profile data and to the consumer load profile data and having slack variables representing the aggregate tap loads, in which the known values corresponding to the consumer load profile data are scaled by the bypass diversion factors, and (ii) minimize an objective function whose value is positively related to the sum of the slack variables representing the aggregate tap loads, and identify a bypass diversion factor of at least two as a bypass theft and locate the bypass theft based on a location of the consumer node corresponding to that bypass diversion factor. The data processor may be configured to generate a record in a non-transitory medium indicating the determined bypass diversion factors and aggregate tap loads.

Yet another aspect of the invention provides a system for identifying and locating tap loads in an electric utility power distribution inventory zone, the inventory zone comprising a plurality of nodes including at least one metered distribution node and at least two metered consumer nodes. In some embodiments, the system comprises a data store comprising a non-transitory computer readable medium of the data store contains an admittance matrix modeling the electrical admittance between the nodes of the inventory zone, real and reactive load data for each of the metered nodes of the inventory zone, and voltage magnitude data for each of the metered nodes of the inventory zone, and a data processor communicatively coupled to the data store. The data processor may be configured to obtain the admittance matrix from the data store, obtain the real and reactive load data from the data store, obtain the voltage magnitude data from the data store, determine a voltage phase angle for each of the consumer nodes that solve a first system of power flow equations for the inventory zone having known values corresponding to the real and reactive load data for the consumer nodes and in which the distribution node is treated as a slack node, determine real and reactive unmetered tap loads corresponding to select ones of the consumer nodes that (i) solve a second system of power flow equations for the inventory zone having known values corresponding to the real and reactive load data for each of the nodes, voltage magnitude values corresponding to the voltage data for each of the metered nodes, and having slack variables representing the real and reactive unmetered tap loads, and (ii) minimize an objective function whose value is positively related to at least one of the slack variables representing the real and reactive unmetered tap loads using an iterative numerical solution technique wherein variables in the second system of power flow equations corresponding to the voltage phase angles of the select ones of the consumer nodes are initialized to values corresponding to the corresponding determined voltage phase angles that solve the first system of power flow equations, and identify any of the real and reactive unmetered tap loads having a value exceeding a pre-determined threshold as a tap theft and locate the tap theft based on a location of the corresponding consumer node. The data processor may be configured to generate a record in a non-transitory medium indicating the determined real and reactive unmetered tap loads corresponding to the select ones of the consumer nodes.

In addition to the exemplary aspects and embodiments described above, further aspects and embodiments will become apparent by reference to the drawings and by study of the following detailed descriptions.

BRIEF DESCRIPTION OF THE DRAWINGS

The accompanying drawings show non-limiting example embodiments.

DETAILED DESCRIPTION

Throughout the following description specific details are set forth in order to provide a more thorough understanding to persons skilled in the art. However, well known elements may not have been shown or described in detail to avoid unnecessarily obscuring the disclosure. Accordingly, the description and drawings are to be regarded in an illustrative, rather than a restrictive, sense.

Figure 1:
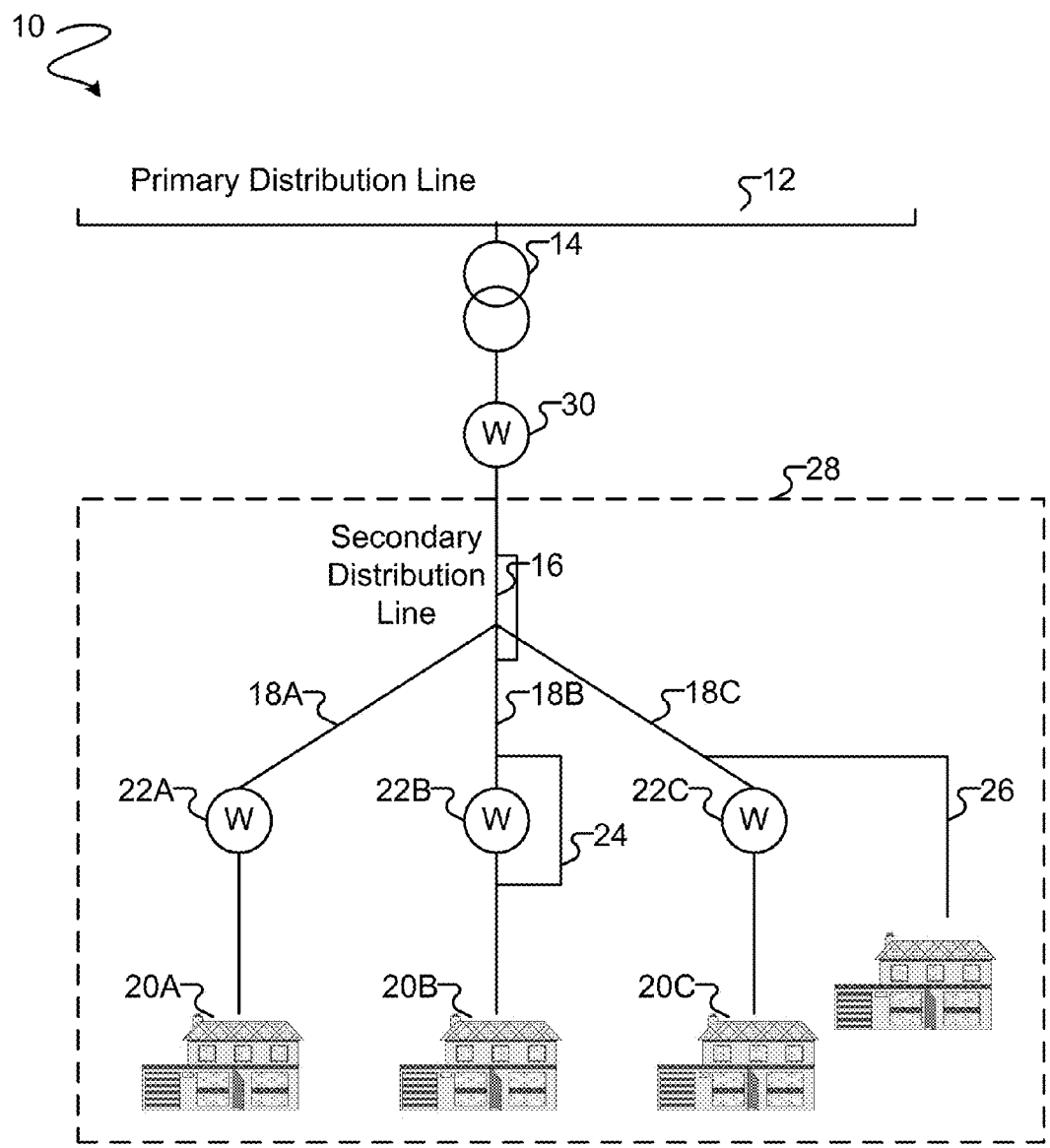
FIG. 1 is a schematic diagram of part of an electric energy distribution system 10.
Figure 2:
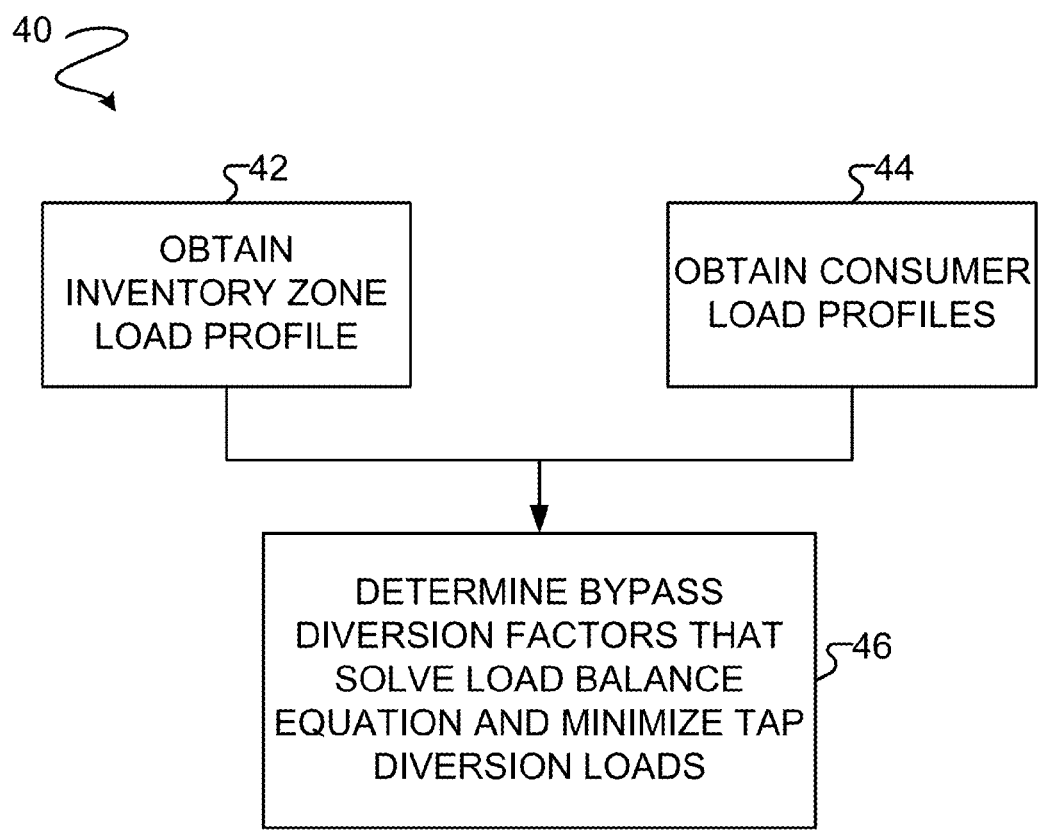
FIG. 2 is a flowchart of a method according to an example embodiment.

One aspect of the invention provides methods and apparatus for distinguishing between bypass diversions and tap diversions in an inventory zone. FIG. 2 illustrates a method 40 according to an example embodiment. Step 42 comprises obtaining metered inventory zone load profile data (e.g., a vector $w_{zone}$). Step 44 comprises obtaining metered consumer load profile data for the inventory zone (e.g., a matrix $W_{consumer}$). Load profile data obtained in steps 42 and 44 may comprise, for example, time series load measurements obtained at each of a plurality of meters substantially synchronously (e.g., at consecutive one hour intervals according to a common clock). Load profile data may be referred to in the electric power utility industry as "interval data". Steps 42 and 44 may comprise obtaining substantially simultaneously acquired load measurements from a network of meters connected by a wired or wireless network, for example.

In some embodiments, the metered inventory zone and consumer load profile data obtained in steps 42 and 44 comprises substantially instantaneous measurements acquired from the meters substantially simultaneously. In other embodiments, the metered inventory zone and consumer load profile data obtained in steps 42 and 44 comprises average measurements acquired from the meters substantially simultaneously, wherein the average measurements represent an average reading from each meter over the same particular span of time (e.g. a time period of 5 minutes, 10 minutes, 15 minutes, or any other time period for which the meters report interval data).

Step 46 comprises determining bypass diversion factors k (e.g., each $k_j$ a multiplier of the value $w_{ij}$ required for the product $w_{ij}k_j$ to reflect the $j^{th}$ consumer's metered load and bypass load at the $i^{th}$ time interval) and tap loads s (e.g., each $s_i$ represents the total energy in the $i^{th}$ time interval that cannot be correlated with any consumer's metered consumption) that:

(1) minimize an objective function whose value is positively related to the sum of tap loads s (e.g., $Z=\Sigma s$ represents the sum total energy not attributable to metered consumption or bypass diversions, which is attributed to tap diversion losses), and (2) solve a system of load balance equations (one equation for each interval i) in which tap loads s are slack variables:

$$\begin{bmatrix} w_{11} & \cdots & w_{1j} \\ \vdots & \ddots & \vdots \\ w_{i1} & \cdots & w_{ij} \end{bmatrix} \begin{bmatrix} k_1 \\ \vdots \\ k_j \end{bmatrix} + \begin{bmatrix} s_1 \\ \vdots \\ s_i \end{bmatrix} = \begin{bmatrix} w_{z1} \\ \vdots \\ w_{zi} \end{bmatrix} \quad (2)$$

under the constraint $k_j \geq 1 \forall k$ and $s_i \geq 0 \forall s$. For convenience, the matrix equality (2) may be expressed as $W_{consumer}k+s=W_{zone}$, where s is a vector of aggregate tap loads for the inventory zone in each time interval (i.e., $s=[s_i]_m$). Put another way, step 46 comprises finding bypass diversion factors k and time series aggregate tap loads s that solve equation (2) and minimize an objective function whose value is positively related to the sum of tap loads under the constraints $k_j \geq 1 \forall k$ and $s_i \geq 0 \forall s$. In some embodiments, the constraint on values in k is specified to be a value less than one (e.g., $k_j \leq a \forall k$ where a is a value between 0.95 and 1, such as 0.98 for example), such as to allow for discrete measurement resolution, for example.

In some embodiments, the Simplex solution method may be used to obtain a solution for bypass diversion factors k and aggregate tap loads s that minimizes Z, though other mathematical techniques for minimizing Z can be used. It may also be possible to use other objective functions for Z. In some embodiments, a Generalized Reduced Gradient solution method, as described below, may be used to obtain a solution for bypass diversion factors k and aggregate tap loads s that minimizes a non-linear objective function.

Depending on the magnitude of aggregate tap loads, in some situations it may be necessary for at least one of the i intervals to have no taps loads in order to determine bypass diversion factors k. For example, in some situations a large, continuous tap load could be incorrectly identified as multiple bypasses. Accordingly, in some embodiments, method 40 may comprise selecting intervals that span a time period that includes a tap load transition (e.g., the beginning or end of a tap load). For example, a tap load transition may be identified when there is a discontinuity in the amount of un-accounted for energy delivered to an inventory zone.

Once bypass diversion factors k are obtained, an element $k_j$ whose value is 1 indicates that the $j^{th}$ consumer's meter is not affected by a bypass diversion. An element $k_j$ whose value is $n>1$ indicates that the $j^{th}$ consumer's meter is affected by a bypass diversion and that only $1/n$ of the energy consumed by this consumer is registered in the meter (i.e., the remaining $(n-1)/n$ of the energy consumed bypasses the meter). Accordingly, bypass diversion losses in the inventory zone can be computed for each time interval i as $\Sigma_j [w_{ij}(k_j - 1)]$.

In some embodiments, method 40 or similar methods may be used to determine consumer connectivity. For example, in some situations an operator of electric power utility may be unsure whether or not a particular consumer is connected to a particular distribution transformer (e.g. due to incomplete or incorrect records). In such a case, the operator may include that consumer in the inventory zone, modify the constraints such that $k_j \geq 0$ and the bypass diversion factor k for that consumer determined by method 40 will indicate whether or not that consumer is connected to that distribution transformer, wherein a k value of 0 indicates that the user is not connected.

In some situations, certain ones of bypass diversion factors k may have values slightly greater than 1 (e.g. 1.1, 1.2, etc.). Such values are likely the result of numerical artifacts, rather than actual bypasses, as the minimum diversion factor for a typical bypass has a value of about 2. Accordingly, in some embodiments additional constraints may be imposed to exclude such results, for example by making the bypass diversion factors k semi-continuous values. For example, additional constraints may be imposed by allowing values equal to 1, or greater than or equal to 2 (or, for example, 1.9 or some other typical minimal diversion factor for the distribution system under study), but not the values between 1 and about 2. In such embodiments, by not permitting bypass diversion factors k to have values slightly greater than 1, small false positives may be eliminated, thereby making actual bypasses more readily identifiable.

In some situations, there may be legitimate unmetered loads (e.g., street lights, traffic lights, technical losses) that are part of the aggregate tap loads s. In such situations, step 46 may comprise solving the following modified version of equation (2) above:

$$\begin{bmatrix} w_{11} & \cdots & w_{1j} & w_{1sl} & w_{1cl} & w_{1tl} \\ \vdots & \ddots & \vdots & \vdots & \vdots & \vdots \\ w_{i1} & \cdots & w_{ij} & w_{isl} & w_{icl} & w_{itl} \end{bmatrix} \begin{bmatrix} k_1 \\ \vdots \\ k_j \\ k_{sl} \\ k_{cl} \\ k_{tl} \end{bmatrix} + \begin{bmatrix} s_1 \\ \vdots \\ s_i \end{bmatrix} = \begin{bmatrix} w_{z1} \\ \vdots \\ w_{zi} \end{bmatrix} \quad (2A)$$

where $w_{1sl} \ldots w_{isl}$ are simulated or "synthetic" meter readings representing the energy consumption of 1 kW of switched loads (e.g. street lights, which turn on when it is dark) for each of the i intervals, $w_{1cl} \ldots w_{icl}$ are simulated or "synthetic" meter readings representing the energy consumption of 1 kW of constant loads (e.g. traffic lights, which operate throughout the day) for each of the i intervals, and $w_{1tl} \ldots w_{itl}$ are equal to the total system load (e.g., the transformer meter readings for the inventory zone) for each of the i intervals. Likewise, $k_{sl}$, $k_{cl}$ and $k_{tl}$ represent multipliers for switched loads, constant loads, and technical losses, respectively (as opposed to bypass diversion factors, since such loads would not typically be bypassed).

The $k_{si}$ and $k_{cl}$ multipliers for the street light and constant load quantities represents the kW of connected load for each of these. The $k_{tl}$ multiplier for the technical losses quantity represents the percentage technical losses experienced by the portion of the distribution system under study. The slack quantity vector s in equation (2A) thus only represents the unaccounted-for tap theft.

When synthesizing the street light interval data, it is best to slightly underestimate the time that the street lights are on. The synthetic data should have the street light turning on later and turning off earlier than would be actually expected due to the photocell operation. This is done to avoid possibly having a situation where actual street light load is not disaggregated from tap theft because to do so would means that there would be intervals where the total load consumed exceeds the output of the transformer.

Equation (2A) may be solved using optimization techniques such as those described above for solving equation (2). The bypass diversion factors k are varied as appropriate to reach a solution that minimizes the sum of the tap loads s vector elements. That is to say that the solution technique first tries to account for the missing energy using bypass theft and known types of unmetered load—collectively indicated in the bypass diversion factors k vector. Any missing energy that cannot be so explained is then considered to be tap theft as indicated by the tap loads s vector.

It should be noted that it is theoretically possible that some or all of the missing energy that is attributed to bypass theft by method 40 could be tap theft. This could be regarded as the trivial solution to the problem. While possible, this trivial solution is highly improbable. This kind of type I false positive error becomes more and more unlikely as the amount of interval data being analyzed increases. It is therefore estimated that the bypass theft methods and systems disclosed herein has at least a 90% probability of identifying bypass thefts to the individual customer level.

Like energy inventory analysis, method 40 will detect all cases of theft—both bypass and tap. Furthermore, with its ability to identify legitimate unmetered loads and technical losses as discussed above with respect to equation (2A), method 40 detects theft with very few false positives. Power distribution monitoring systems configured to implement method 40 also detect and locate bypass theft right down to the individual customer level. Such systems and methods are therefore far superior to energy inventory analysis alone. As one of skill in the art will appreciate, once thefts have been identified and located, a variety of subsequent steps may be taken to address the thefts, including the example steps discussed below with reference to FIG. 5.

Figure 3:
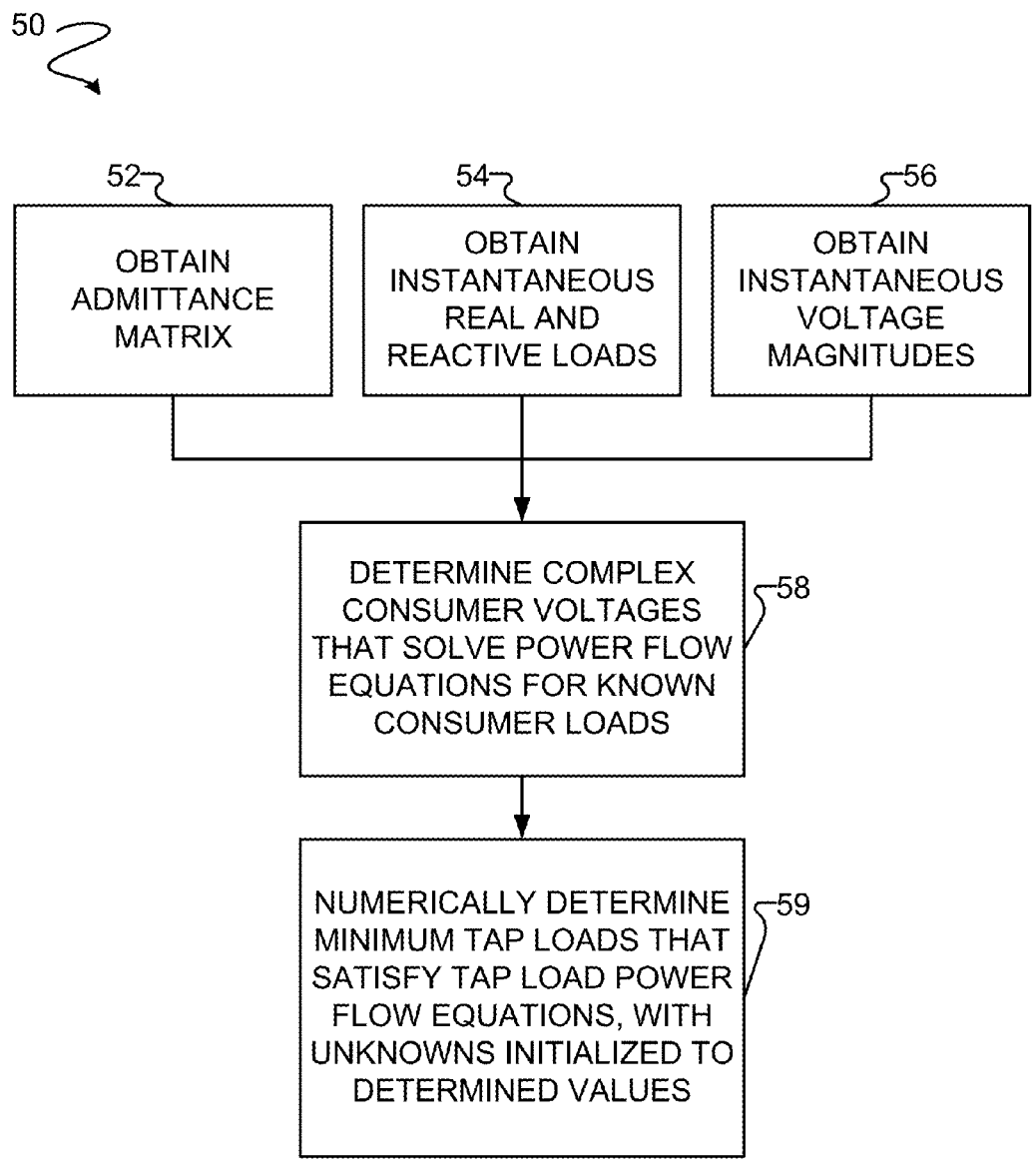
FIG. 3 is a flowchart of a method according to an example embodiment.
Figure 4:
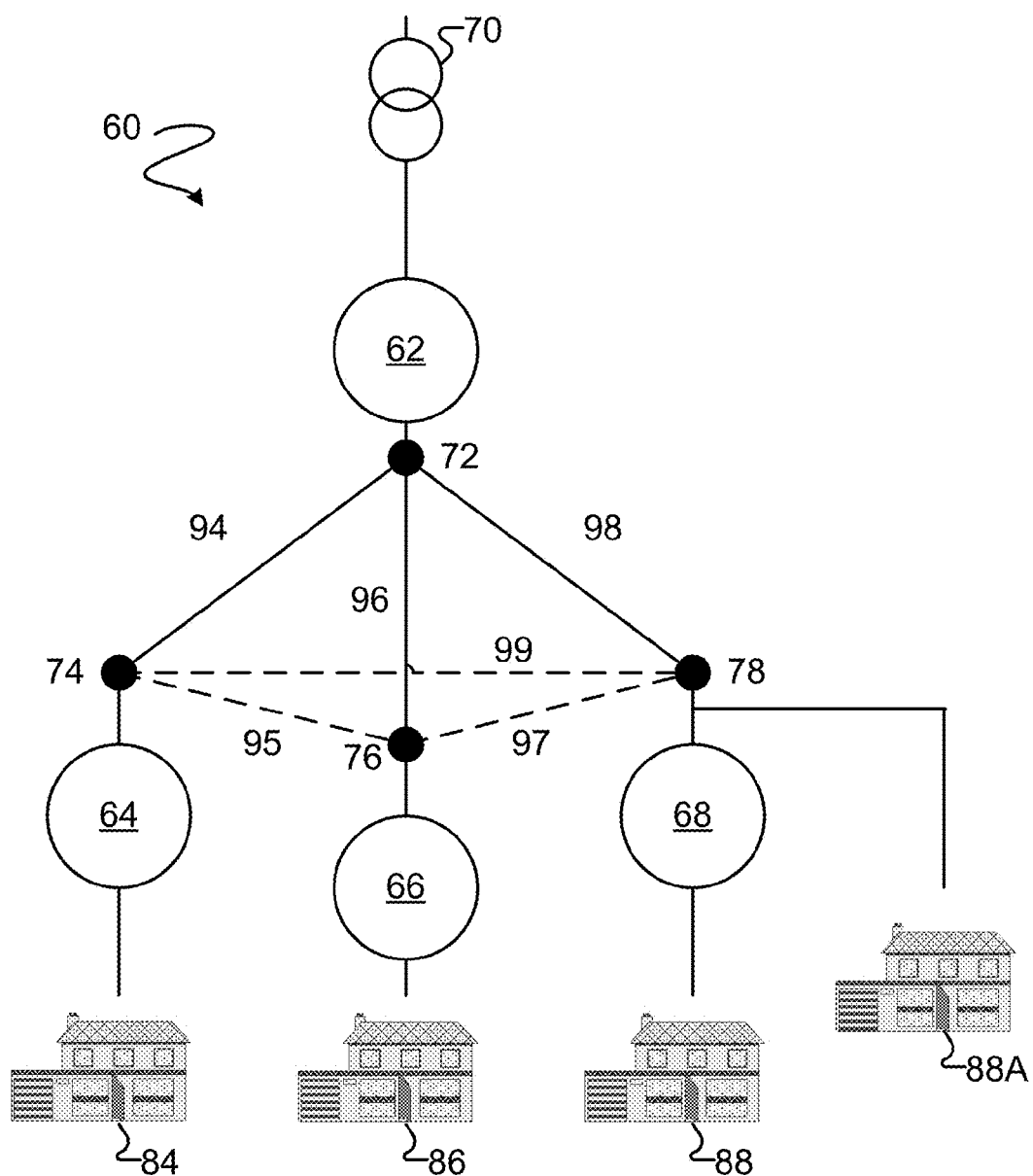
FIG. 4 is a schematic diagram of an example inventory zone, which is referred to in describing the example method illustrated by FIG. 3.

Another aspect of the invention provides methods and apparatus for identifying locations of tap diversions in an inventory zone. FIG. 3 illustrates a method 50 for identifying locations of tap diversions in an inventory zone according to an example embodiment. FIG. 4 is a schematic diagram of an example inventory zone 60, which is referred to in describing method 50. In inventory zone 60, distribution transformer meter 62 and consumer meters 64, 66 and 68 measure power distributed from a power distribution transformer 70 through an electrical network of nodes 72, 74, 76 and 78 to consumers 84, 86 and 88. Nodes 72, 74, 76 and 78 are respectively associated with distribution transformer distribution meter 62 and consumer meters 64, 66 and 68. Inventory zone 60 includes an unmetered tap load 88A downstream of node 78.

Step 52 comprises obtaining an admittance matrix Y modeling the electrical admittance between all nodes in the inventory zone. FIG. 4 shows electric paths 94, 96 and 98 between node 72 and nodes 74, 76 and 78, which paths have admittances $Y_{12}$, $Y_{13}$ and $Y_{14}$ respectively. Paths 95, 97 and 99, which have admittances $Y_{23}$, $Y_{24}$ and $Y_{34}$, respectively, are shown notionally in FIG. 4. In the FIG. 4 topology, paths 95, 97 and 99 may be zero, but in other topologies may have non-negligible values. In what follows, elements of Y are expressed as $G_{ik}+jB_{ik}$, where $G_{ik}$ is the magnitude of the real part (also referred to as "conductance") of the element in the admittance matrix Y at the $i^{th}$ row and $k^{th}$ column and $B_{ik}$ is the magnitude of the imaginary part (also referred to as "susceptance") of the element in the admittance matrix Y at the $i^{th}$ row and $k^{th}$ column (i.e., $Y=[G_{ik}+jB_{ik}]_{N \times N}$).

Step 54 comprises obtaining substantially simultaneous values for "known" real and reactive loads $P_i$ and $Q_i$ at all metered nodes $N_i$ in the inventory zone (representing energy injected into or removed from nodes 72, 74, 76 and 78, which may be measured, at least in part, by meters 62, 64, 66 and 68, respectively). Step 54 may comprise obtaining substantially simultaneously acquired meter values for instantaneous real and reactive loads at all metered nodes $N_i$ in the inventory zone, or may comprise obtaining average measurements acquired from the meters substantially simultaneously, wherein the average measurements represent an average reading from each meter over the same particular span of time (e.g. a time period of 5 minutes, 10 minutes, 15 minutes, or any other time period for which the meters report interval data). Where the inventory zone contains bypass diversion (e.g., because a value for $k_j \geq 1$ was determined for at least one node $N_i$ in method 40), step 54 may comprise scaling the instantaneous real and reactive metered loads at nodes $N_i$ affected by bypass diversions by their corresponding bypass diversion factors $k_i$.

Step 56 comprises obtaining substantially simultaneous values for the voltage magnitude $|V_i|$ at all metered nodes in the inventory zone, such as might be measured by meters 62, 64, 66 and 68, for example. In some embodiments, step 56 comprises obtaining substantially simultaneously acquired values for the instantaneous voltage magnitude $|V_i|$ at all or less than all metered nodes in the inventory zone. In some embodiments, step 56 comprises obtaining average measurements acquired from the meters substantially simultaneously, wherein the average measurements represent an average reading from each meter over the same particular span of time (e.g. a time period of 5 minutes, 10 minutes, 15 minutes, or any other time period for which the meters report interval data).

Step 58 comprises determining complex voltages (magnitude $|V_i|$ and angle $\theta_i$) for each consumer node by solving an exactly determined first system of real and reactive power flow equations in which the distribution transformer node is treated as a slack node.

The following two equations are example forms of real and reactive power flow equations that may be solved for each node $N_i$ simultaneously in step 58:

$$0 = -P_i + \sum_{k=1}^{N} |V_i||V_k|(G_{ik}\cos(\theta_i - \theta_k) + B_{ik}\sin(\theta_i - \theta_k)) \quad (3)$$

$$0 = -Q_i + \sum_{k=1}^{N} |V_i||V_k|(G_{ik}\sin(\theta_i - \theta_k) + B_{ik}\cos(\theta_i - \theta_k)) \quad (4)$$

In equations (3) and (4):

$P_i$ is the real load at node $N_i$ and
  where node $N_i$ is one of consumer nodes 74, 76 and 78, $P_i$ has the value obtained in step 54, and
  where node $N_i$ is the distribution transformer node 72, $P_i$ is treated as unknown;

$Q_i$ is the reactive load at node $N_i$ and
  where node $N_i$ is one of consumer nodes 74, 76 and 78, $Q_i$ has the value obtained in step 54, and
  where node $N_i$ is the distribution transformer node 72, $Q_i$ is treated as unknown;

$|V_i|$ is the voltage magnitude at node $N_i$ and
  where node $N_i$ is one of consumer nodes 74, 76 and 78, $|V_i|$ is treated as unknown; $N_i$ may be initialized to an arbitrary value (e.g., a nominal system voltage for a "flat start") or to a value obtained in step 56 (e.g., for distribution transformer node 72, for node $N_i$, or for another consumer node);
  where node $N_i$ is distribution transformer node 72, $|V_i|$ has the value obtained in step 56 for distribution transformer node 72;

$G_{ik}$ is the real part of the element at the $i^{th}$ row and $k^{th}$ column in the admittance matrix Y determined in step 52;

$B_{ik}$ is the imaginary part of the element at the $i^{th}$ row and $k^{th}$ column in the admittance matrix Y determined in step 52;

$\theta_i$ is the voltage phase angle at node $N_i$ and
  where node $N_i$ is one of consumer nodes 74, 76 and 78, $\theta_i$ is treated as unknown and initialized to an arbitrary value (e.g., zero for a "flat start"), and
  where node $N_i$ is distribution transformer node 72, $\theta_i$ is fixed arbitrarily at an arbitrary value (e.g, the same value as the initial value of $\theta_i$ for consumer nodes, such as zero for a "flat start").

The solution obtained to the system of real and reactive power flow equations represents the power flow solution for "known" consumer loads, and is used as the starting point for finding tap theft locations in step 59. Numerical methods, such as the Newton-Raphson and Generalized Reduced Gradient methods, for example, may be used to solve the power flow equations to obtain complex voltages for consumer nodes. It will be appreciated that though a system of equations having equations in the form of equations (3) and (4) for each node in an inventory zone has the same number of equations as it does unknowns, the initial approximations of the unknowns may affect whether numerical methods converge to the solution of the system.

Step 59 comprises determining real tap loads $P_i^T$ and/or reactive tap loads $Q_i^T$ corresponding to one or more nodes $N_i$ that:

(1) minimize an objective function Z whose value is positively related to the sum total of the magnitudes of the determined real and reactive tap loads (e.g., $Z=\sqrt{\Sigma_{i=1}^N (P_i^2 + Q_i^2)}$), and (2) solve a second system of real and reactive power flow balance equations in which tap affected voltage phase angles $\theta_i^T$ at consumer nodes are unknown variables and the real tap loads $P_i^T$ and/or reactive tap loads $Q_i^T$ are slack variables.

Put another way, step 59 comprises finding consumer node voltage phase angles $\theta_i^T$ and one or more real and reactive tap loads $P_i^T$ and $Q_i^T$ corresponding to one or more nodes $N_i$ that solve a second system of real and reactive power flow balance equations in which the real and reactive tap loads are slack variables and minimize an objective function whose value is positively related to the apparent power of the determined tap loads (i.e., the square root of the sum of the squares of the determined real and reactive tap loads). Real and reactive tap loads $P_i^T$ and $Q_i^T$ may be determined in step 59 by using a numerical method in which the variables for tap affected voltage phase angle $\theta_i^T$ at consumer nodes are initialized to the value $\theta_i$ determined in step 58.

The following two equations are example forms of real and reactive power flow equations that may be solved in step 59:

$$0 = -P_i^T - P_i + \sum_{k=1}^N |V_i||V_k|(G_{ik}\cos(\theta_i^T - \theta_k^T) + B_{ik}\sin(\theta_i^T - \theta_k^T)) \quad (5)$$

$$0 = -Q_i^T - Q_i + \sum_{k=1}^N |V_i||V_k|(G_{ik}\sin(\theta_i^T - \theta_k^T) - B_{ik}\cos(\theta_i^T - \theta_k^T)) \quad (6)$$

In equations (5) and (6):

$P_i^T$ is the unknown real tap load at node $N_i$, and is initialized to zero;

$Q_i^T$ is the unknown reactive tap load at node $N_i$, and is initialized to zero;

$P_i$ is the known real load at node $N_i$ obtained in step 54;

$Q_i$ is the known reactive load at node $N_i$ obtained in step 54;

$|V_i|$ is the measured voltage magnitude at node $N_i$ obtained in step 56;

$G_{ik}$ is the real part of the element at the $i^{th}$ row and $k^{th}$ column in the admittance matrix Y determined in step 52;

$B_{ik}$ is the imaginary part of the element at the $i^{th}$ row and $k^{th}$ column in the admittance matrix Y determined in step 52;

$\theta_i^T$ is the unknown tap affected voltage phase angle at node $N_i$ and where node $N_i$ is a consumer node, $\theta_i^T$ is initialized to the value of $\theta_i$ determined in step 58, and where node $N_i$ is the distribution transformer node, $\theta_i^T$ is fixed at the same value it was fixed at in step 58 (e.g., to zero).

In some cases, the initialization of $\theta_i^T$ in step 59 to the value of $\theta_i$ determined in step 58 may promote convergence of the optimization of the second system of equations to a solution that places the tap theft loads $P_i^T$ and $Q_i^T$ at the correct nodes.

The solution obtained in step 59 represents the power flow solution for the "known" consumer loads, measured consumer voltage magnitudes and the solution set of tap affected node voltage angles of $\theta_i^T$, and the solution set of $P_i^T$ and $Q_i^T$ tap theft loads values. Nodes having relatively larger values of $P_i^T$ (and/or $Q_i^T$) are relatively more likely to be affected by tap diversions. Nodes having values of $P_i^T$ that are zero or relatively close to zero are more likely to not be affected by tap diversions.

There may be cases where the step 59 optimization does not converge to a valid solution. In some embodiments, one or more additional constraints may be added to the system of equations that constrains the step 59 optimization to promote convergence to a valid solution. For example, in some embodiments equations specifying a relationship between the variables $P_i^T$ and $Q_i^T$ for one or more nodes $N_i$ having these variables in their corresponding power flow equations are added to a system of real and reactive power flow equations that constrains the step 59 optimization. For example, a linearly proportional relationship between $P_i^T$ and $Q_i^T$ may be specified, such in the form $Q_i^T = \alpha P_i^T$ to further constrain the step 59 optimization. In a non-limiting example embodiment, $\alpha$ is specified as 0.2.

A specified relationship between $P_i^T$ and $Q_i^T$ may reflect an estimated or expected power factor of the possible tap load at the node. For instance, where $PF_i$ denotes the expected or estimated power factor of a possible tap load at node $N_i$ equations in the form $$Q_i^T = P_i^T \sqrt{\frac{(1 - PF_i^2)}{PF_i^2}} \quad (7)$$

may be added to a system of real and reactive power flow equations that constrains the step 59 optimization. $PF_i$ may be the same or different among nodes in an inventory zone. In some embodiments, power factor $PF_i$ for possible tap loads may be estimated based on a difference between values for $P_i$ and $Q_i$ determined for the distribution node in step 58 and values for real and reactive power measured for the distribution node in step 54. The difference between the power values determined in step 58 and the power values measured in step 54 reflects the aggregate tap load, and a power factor determined from the real and reactive power differences reflects the power factor of the aggregate tap load. This power factor may be used as an estimate of the power factor $PF_i$ of the individual possible tap loads, and accordingly used to relate $P_i^T$ and $Q_i^T$ to further constrain the second system of power flow equations solved in step 59. In some embodiments, a power factor for tap loads is specified based on expectations derived from past experience (e.g., power factor of tap loads previously detected in that inventory zone or other inventory zones).

In some embodiments, slack variables $P_i^T$ in the system of equations of the step 59 optimization may be constrained to values greater than or equal to a small negative number to promote convergence. The small negative value may be selected based on expected maximum measurement errors. For example, slack variables $P_i^T$ may be constrained to be at least −3 KW. Allowing slack variables $P_i^T$ to take on negative KW values that would result from the bus voltage changing by the maximum voltage measurement error for the meter permits any over-registration metering errors (e.g., the meter reading is higher than the true value) to be converted into negative $P_i^T$ values that increases the likelihood that the power flow equations will converge to a solution. Looking at that solution, all the $P_i^T$ values whose absolute value is less that the previously allowed KW tolerance (e.g. about 3 or 4 KW) most likely denote nodes with measurement errors only—i.e. they do not have any tap theft. Solving for the actual (not measured) node voltages could then continue by zeroing out all those $P_i^T$ values and keeping only the remaining large thefts for the solution, in order to locate and quantify those tap thefts. An example method that allows small negative values and accounts for possible tap loads at the consumer nodes and one of the distribution nodes is described below with reference to FIG. 9.

The following tables illustrate an example solution where slack variables $P_i^T$ are allowed to take on small negative values in an inventory zone with three distribution line segments and sixteen customers. In the illustrated example, a 20 KW tap at node "line #3" and a 10 KW tap at node "cust #4" are simulated.

TABLE 1 example solution for tap theft with measurement error:

| Nodes | V(magn) | θ(rad) | θ(°) | P(soln) | Q(soln) | P(load) | Q(load) | P(tap) | Q(tap) |
|---|---|---|---|---|---|---|---|---|---|
| xfmr | 1.00000 | 0.00000 | 0.0000 | 77.8210 | 0.3003 | 0.00000 | 0.0000 | 0.0000 | 0.0000 |
| line#1 | 0.99644 | −0.00177 | −0.1013 | −1.3294 | 0.0000 | 0.00000 | 0.0000 | 1.3294 | 0.0000 |
| line#2 | 0.99703 | −0.00147 | −0.0845 | 1.8549 | 0.0000 | 0.00000 | 0.0000 | −1.8549 | 0.0000 |
| line#3 | 0.99221 | −0.00389 | −0.2226 | −18.4143 | 0.0000 | 0.00000 | 0.0000 | 18.4143 | 0.0000 |
| cust#1 | 0.99345 | −0.00327 | −0.1874 | −4.8169 | 0.0000 | 3.97800 | 0.0000 | 0.8389 | 0.0000 |
| cust#2 | 0.99515 | −0.00242 | −0.1385 | −2.0865 | 0.0000 | 2.44600 | 0.0000 | −0.3595 | 0.0000 |
| cust#3 | 0.99314 | −0.00342 | −0.1962 | −5.3078 | 0.0000 | 4.01800 | 0.0000 | 1.2898 | 0.0000 |
| cust#4 | 0.98931 | −0.00535 | −0.3063 | −11.4263 | 0.0000 | 4.47600 | 0.0000 | 6.9503 | 0.0000 |
| cust#5 | 0.99731 | −0.00134 | −0.0770 | −4.3392 | 0.0000 | 4.27800 | 0.0000 | 0.0612 | 0.0000 |
| cust#6 | 0.99893 | −0.00054 | −0.0307 | −1.7341 | 0.0000 | 1.27900 | 0.0000 | 0.4551 | 0.0000 |
| cust#7 | 0.99906 | −0.00047 | −0.0269 | −1.5198 | 0.0000 | 3.60800 | 0.0000 | −2.0882 | 0.0000 |
| cust#8 | 0.99816 | −0.00092 | −0.0528 | −2.9784 | 0.0000 | 2.32100 | 0.0000 | 0.6574 | 0.0000 |
| cust#9 | 0.99753 | −0.00122 | −0.0700 | 0.8145 | 0.0000 | 1.06800 | 0.0000 | −1.8825 | 0.0000 |
| cust#10 | 0.99308 | −0.00345 | −0.1979 | −6.3494 | −0.0016 | 3.21800 | 0.0000 | 3.1314 | 0.0000 |
| cust#11 | 0.99613 | −0.00192 | −0.1102 | −1.4441 | 0.0000 | 2.18100 | 0.0000 | −0.7369 | 0.0000 |
| cust#12 | 0.99531 | −0.00234 | −0.1338 | −2.7678 | 0.0000 | 1.45100 | 0.0000 | 1.3168 | 0.0000 |
| cust#13 | 0.98860 | −0.00570 | −0.3267 | −5.7711 | 0.0000 | 3.32700 | 0.0000 | 2.4441 | 0.0000 |
| cust#14 | 0.99091 | −0.00454 | −0.2600 | −2.0796 | 0.0000 | 4.27000 | 0.0000 | −2.1904 | 0.0000 |
| cust#15 | 0.98828 | −0.00587 | −0.3361 | −6.2936 | 0.0000 | 3.13500 | 0.0000 | 3.1586 | 0.0000 |
| cust#16 | 0.99144 | −0.00427 | −0.2448 | −1.2346 | 0.0000 | 3.08500 | 0.0000 | −1.8504 | 0.0000 |

The voltage values shown in Table 1 are fixed at the measured values. As shown in Table 1, slack variables $P_i^T$ are allowed to be greater than or equal to −3 kW. The slack variables $P_i^T$ for nodes "line #3" and "cust #4" have relatively large kW values (indicated in bold), indicating likely tap thefts. Values of slack variables $P_i^T$ whose absolute values are less than about 3 or 4 kW are likely due to measurement error, and are thus forced to take on values of 0, and the power flow equations are solved again, with the voltages allowed to float, and the resulting solution is shown is Table 2 where the slack variables $P_i^T$ for node "line #3" and "cust #4" are now very close to the simulated 20 kW and 10 kW taps.

TABLE 2 example solution where small tap values are zeroed

| Nodes | V(magn) | θ(rad) | θ(°) | P(soln) | Q(soln) | P(load) | Q(load) | P(tap) | Q(tap) |
|---|---|---|---|---|---|---|---|---|---|
| xfmr | 1.00000 | 0.00000 | 0.0000 | 78.7397 | 0.3003 | 0.00000 | 0.0000 | 0.0000 | 0.0000 |
| line#1 | 0.99646 | −0.00176 | −0.1006 | 0.0000 | 0.0000 | 0.00000 | 0.0000 | 0.0000 | 0.0000 |
| line#2 | 0.99702 | −0.00148 | −0.0848 | 0.0000 | −0.0006 | 0.00000 | 0.0000 | 0.0000 | 0.0000 |
| line#3 | 0.99218 | −0.00390 | −0.2235 | −20.1169 | 0.0000 | 0.00000 | 0.0000 | 20.1169 | 0.0000 |
| cust#1 | 0.99399 | −0.00300 | −0.1717 | −3.9780 | 0.0000 | 3.97800 | 0.0000 | 0.0000 | 0.0000 |
| cust#2 | 0.99494 | −0.00252 | −0.1443 | −2.4460 | 0.0000 | 2.44600 | 0.0000 | 0.0000 | 0.0000 |
| cust#3 | 0.99396 | −0.00301 | −0.1724 | −4.0180 | 0.0000 | 4.01800 | 0.0000 | 0.0000 | 0.0000 |
| cust#4 | 0.98747 | −0.00626 | −0.3587 | −14.3602 | 0.0000 | 4.47600 | 0.0000 | 9.8842 | 0.0000 |
| cust#5 | 0.99735 | −0.00132 | −0.0759 | −4.2780 | 0.0000 | 4.27800 | 0.0000 | 0.0000 | 0.0000 |
| cust#6 | 0.99921 | −0.00040 | −0.0226 | −1.2790 | 0.0000 | 1.27900 | 0.0000 | 0.0000 | 0.0000 |
| cust#7 | 0.99777 | −0.00112 | −0.0640 | −3.6080 | 0.0000 | 3.60800 | 0.0000 | 0.0000 | 0.0000 |
| cust#8 | 0.99856 | −0.00072 | −0.0411 | −2.3210 | 0.0000 | 2.32100 | 0.0000 | 0.0000 | 0.0000 |

TABLE 2-continued example solution where small tap values are zeroed

| Nodes | V(magn) | θ(rad) | θ(°) | P(soln) | Q(soln) | P(load) | Q(load) | P(tap) | Q(tap) |
|---|---|---|---|---|---|---|---|---|---|
| cust#9 | 0.99636 | −0.00181 | −0.1039 | −1.0680 | 0.0000 | 1.06800 | 0.0000 | 0.0000 | 0.0000 |
| cust#10 | 0.99502 | −0.00248 | −0.1422 | −3.2180 | 0.0000 | 3.21800 | 0.0000 | 0.0000 | 0.0000 |
| cust#11 | 0.99567 | −0.00216 | −0.1237 | −2.1810 | 0.0000 | 2.18100 | 0.0000 | 0.0000 | 0.0000 |
| cust#12 | 0.99612 | −0.00193 | −0.1107 | −1.4510 | 0.0000 | 1.45100 | 0.0000 | 0.0000 | 0.0000 |
| cust#13 | 0.99011 | −0.00495 | −0.2834 | −3.3270 | 0.0000 | 3.32700 | 0.0000 | 0.0000 | 0.0000 |
| cust#14 | 0.98952 | −0.00524 | −0.3004 | −4.2700 | 0.0000 | 4.27000 | 0.0000 | 0.0000 | 0.0000 |
| cust#15 | 0.99023 | −0.00489 | −0.2800 | −3.1350 | 0.0000 | 3.13500 | 0.0000 | 0.0000 | 0.0000 |
| cust#16 | 0.99026 | −0.00487 | −0.2790 | −3.0850 | 0.0000 | 3.08500 | 0.0000 | 0.0000 | 0.0000 |

In some embodiments, the step 59 power flow equations for one or more nodes do not include one or both of variables $P_i^T$ and $Q_i^T$. For example, variables $P_i^T$ and $Q_i^T$ may not be included in the power flow equation for a node (e.g., the distribution transformer node) when there is confidence that there is no tap diversion proximate to the node. For another example, $Q_i^T$ may not be included in the power flow equation for a node when there is confidence that any tap diversion that might be present at the node does not have an appreciable reactive component. Omitting variables $P_i^T$ and/or $Q_i^T$ from one or more power flow equations reduces the number of unknown variables to be determined in the step 59 optimization, and may promote convergence of the step 59 optimization to a valid solution. In some cases, not including one or both of variables $P_i^T$ and $Q_i^T$ in the step 59 power flow equation for a node that is in fact affected by a tap diversion may result in method 50 allocating the tap diversion among nearby nodes. Where this occurs, the number of tap diversions indicated by the result of method 50 may appear to be unusually large. Variables $P_i^T$ and $Q_i^T$ may be added to the power flow equation of a node for which they were previously omitted that is proximate to a "cluster" of tap diversions indicated by the result, and method 50 performed again with the "new" $P_i^T$ and $Q_i^T$ variables.

Figure 4A:
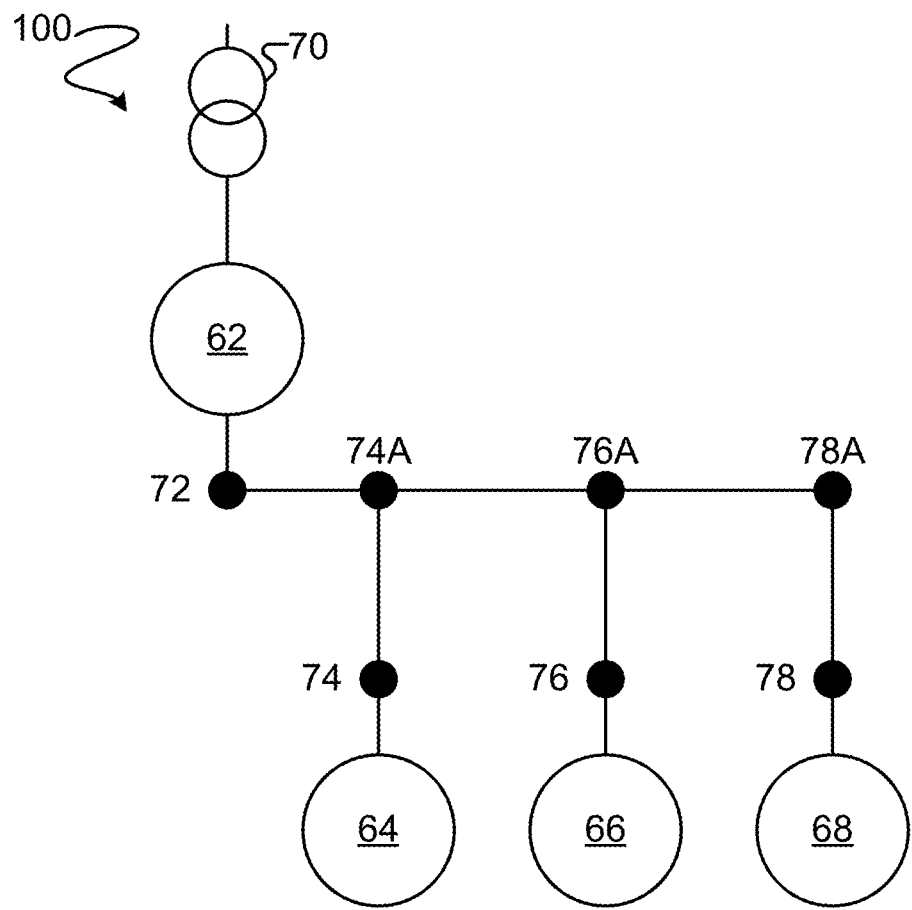
FIG. 4A is a schematic diagram of a model of an inventory zone corresponding to the inventory zone shown in FIG. 4.

In some cases it may be necessary or convenient to include unmetered nodes in applications of method 50. For example, an electric power utility's admittance model for a distribution network in an inventory zone may comprise unmetered nodes (e.g., in order to correspond with the physical topology of the inventory zone). FIG. 4A shows an example model 100 that corresponds to inventory zone 60 shown in FIG. 4. In model 100, metered nodes 74, 76 and 78 are connected to corresponding unmetered intermediate nodes 74A, 76A and 78A. Nodes 74A, 76A and 78A are connected in series to node 72. Power delivered to node 72 is metered by meter 62.

Nodes 74A, 76A and 78A may be included in method 50 as follows.

The admittance matrix obtained in step 52 may contain elements corresponding to paths between nodes 74A, 76A and 78A and the other nodes in the inventory zone.

Since nodes 74A, 76A and 78A are unmetered, no measurements are obtained for them in steps 54 and 56.

In step 58, equations corresponding to nodes 74A, 76A and 78A are included in the first system of power flow equations. In these equations, voltage magnitude $|V_i|$ and phase angle $\theta_i$ are both treated as unknowns, and the real and reactive power terms $P_i$ and $Q_i$ are fixed at arbitrary values (e.g., zero or another small value corresponding to expected technical loss, known unmetered load, etc. at the nodes).

In step 59, equations corresponding to nodes 74A, 76A and 78A are included in the second system of power flow equations. In these equations, voltage magnitude $|V_i|$ and tap affected phase angle $\theta_i^T$ are treated as unknowns. Where the second system of equations is solved using an iterative numerical technique, these unknowns may be initialized to the corresponding values calculated for voltage magnitude $|V_i|$ and phase angle $\theta_i$ in step 58. These equations may not include real and reactive tap power terms $P_i^T$ and $Q_i^T$, since in some cases this could prevent solution of the second system of equations. If it occurs that one or more of nodes 74A, 76A and 78A is in fact affected by a tap diversion, method 50 may allocate the tap diversion among nearby metered nodes. Where the result of step 59 indicates that one or more of nodes 74A, 76A and 78A is surrounded by a "cluster" of tap diversions, variables $P_i^T$ and $Q_i^T$ may be added to the power flow equations for those one or more of nodes 74A, 76A and 78A, and removed from the power flow equations for nearby metered nodes. Step 59 may then be performed again with the "new" $P_i^T$ and $Q_i^T$ variables for the one or more unmetered nodes.

Figure 5:
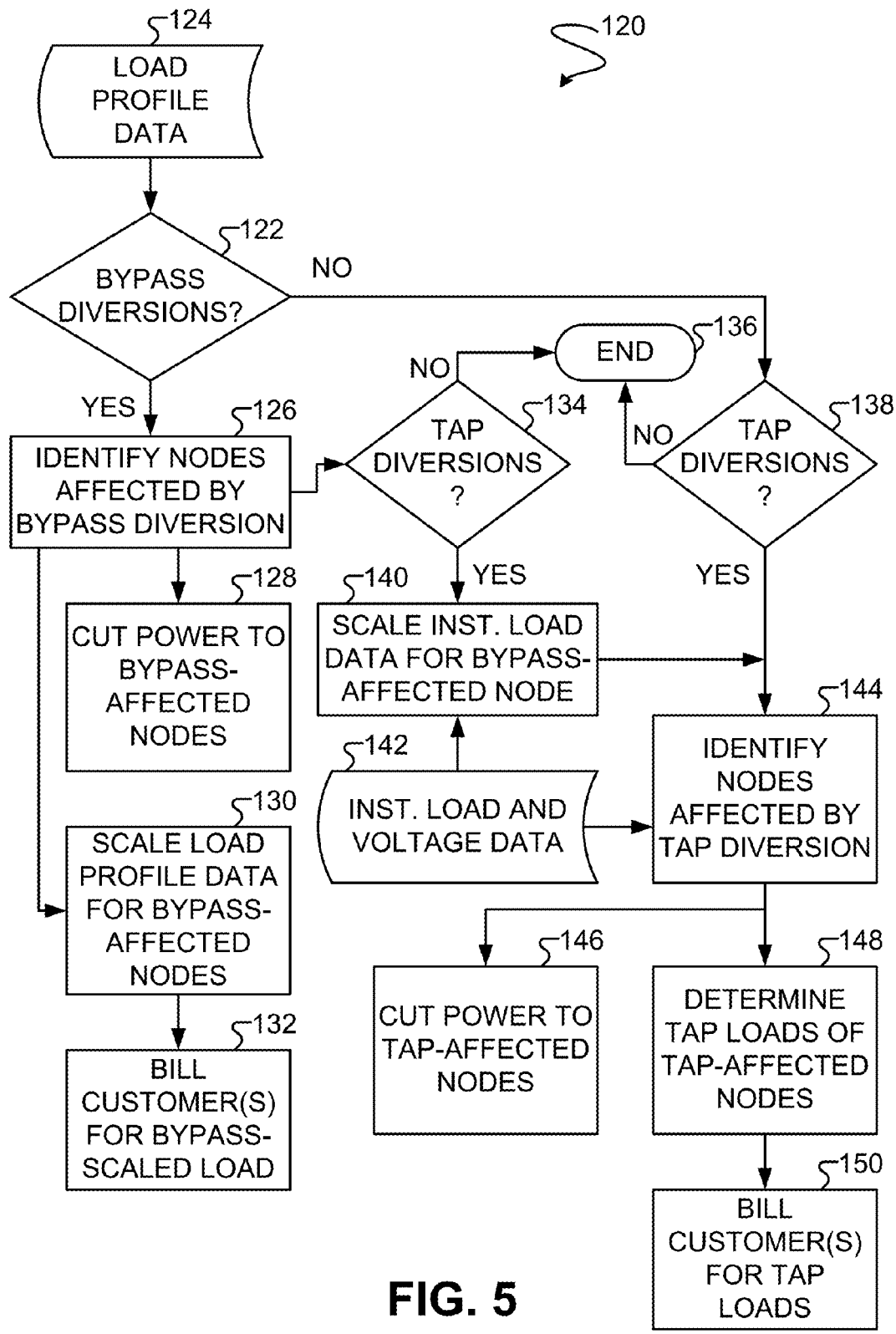
FIG. 5 is a flowchart of a method according to an example embodiment.

Information quantifying and identifying bypass and tap diversions in electric utility networks obtained by practice of methods of the invention (e.g, methods 40 and/or 50), may be used in the automatic control of electric utility networks and billing of customers of such networks. FIG. 5 is a flow chart of a method 120 according to an example embodiment. In method 120, step 122 comprises determining whether there is at least one bypass diversion present in an inventory zone based on load profile data 124 for the inventory zone. Step 122 may comprise one or more steps of method 40, for example. In some embodiments, step 122 comprises whether any node of the inventory zone has a bypass diversion factor determined in step 46 greater than a threshold (e.g., one, a number greater than one).

If in step 122 it is determined that there is at least one bypass diversion in the inventory zone (step 122, YES), method 122 proceeds to step 126. Step 126 comprises identifying the nodes affected by bypass diversion(s) in the inventory zone. In embodiments where step 122 comprises determining a set of bypass diversion factors, as is done in method 40, for example, step 126 may comprise determining which nodes have bypass diversion factors greater than 1, for example. After step 126, method 120 may proceed to either of both of steps 128 and 130. Step 128 comprises cutting power to the bypass-affected nodes identified in step 126. Step 130 comprises scaling load profile data for the bypass-affected nodes identified in step 126. This bypass-scaled load data may be used for billing customers for bypass loads in step 132. It will be appreciated that steps 122 through 132 may be automated (e.g., performed without human intervention). It will also be appreciated that nodes identified as being affected by bypass diversion(s) in step 126 be manually inspected prior to performing one or both of steps 128 and 130.

If in step 122 it is determined that there is not at least one bypass diversion in the inventory zone (step 122, NO), method 122 proceeds to step 138.

Step 126 is also followed by step 134. Both step 134 and 138 comprise determining whether there is one or more tap diversions in the inventory zone. Step 134 and/or step 138 may comprise one or more steps of method 40 for example. In some embodiments, one or both of steps 134 and 138 comprises determining whether any tap diversion loads determined in step 46 of method 40 are non-zero.

If in step 134 or step 138 it is determined that there is not one or more tap diversions in the inventory zone (step 134 or step 138, NO), method 120 proceed to termination 136.

If in step 134 it is determined that there is one or more tap diversions in the inventory zone (step 134, YES), method 120 proceeds to step 140. Step 140 comprises scaling instantaneous load data 142 for bypass-affected nodes identified in step 126. Step 140 may comprise scaling instantaneous load data for a bypass-affected node by a bypass diversion factor determined in step 46 of method 40, for example. After step 140, method 120 proceeds to step 144.

If in step 138 it is determined that there is one or more tap diversions in the inventory zone (step 138, YES), method 120 proceeds to step 144. Step 144 comprises identifying nodes affected by tap diversion based on instantaneous load and voltage data. Step 144 may comprise one or more steps of method 50, for example. In some embodiments, step 144 comprises identifying nodes determined to have real and/or reactive tap load values ($P_i^T$ and $Q_i^T$) determined in step 59 of method 50 greater than a threshold (e.g., in some embodiments, the threshold may be zero, or a number greater than zero).

After step 144, method 120 may proceed to either of both of steps 146 and 148. Step 146 comprises cutting power to the tap-affected nodes identified in step 144. Step 148 comprises determining tap loads for the tap-affected nodes identified in step 144. Step 144 may comprise determining for real and/or reactive tap load values ($P_i^T$ and $Q_i^T$), as in step 59 of method 50, for example. Tap loads determined in step 148 may be used for billing customers for tap loads in step 150. In some embodiments, customers at tap-affected nodes are billed for energy consumption calculated based on the determined tap loads for their nodes and estimated time period in which their tap loads were active (such as may be inferred by analyzing changes in the difference between a metered load or consumption for the inventory zone and the sum of metered load or consumption for consumer nodes in the inventory zone). It will be appreciated that steps 122 through 150 may be automated (e.g., performed without human intervention). It will also be appreciated that nodes identified as being affected by tap diversion(s) in step 144 be manually inspected prior to performing one or both of steps 146 and 150.

Figure 6:
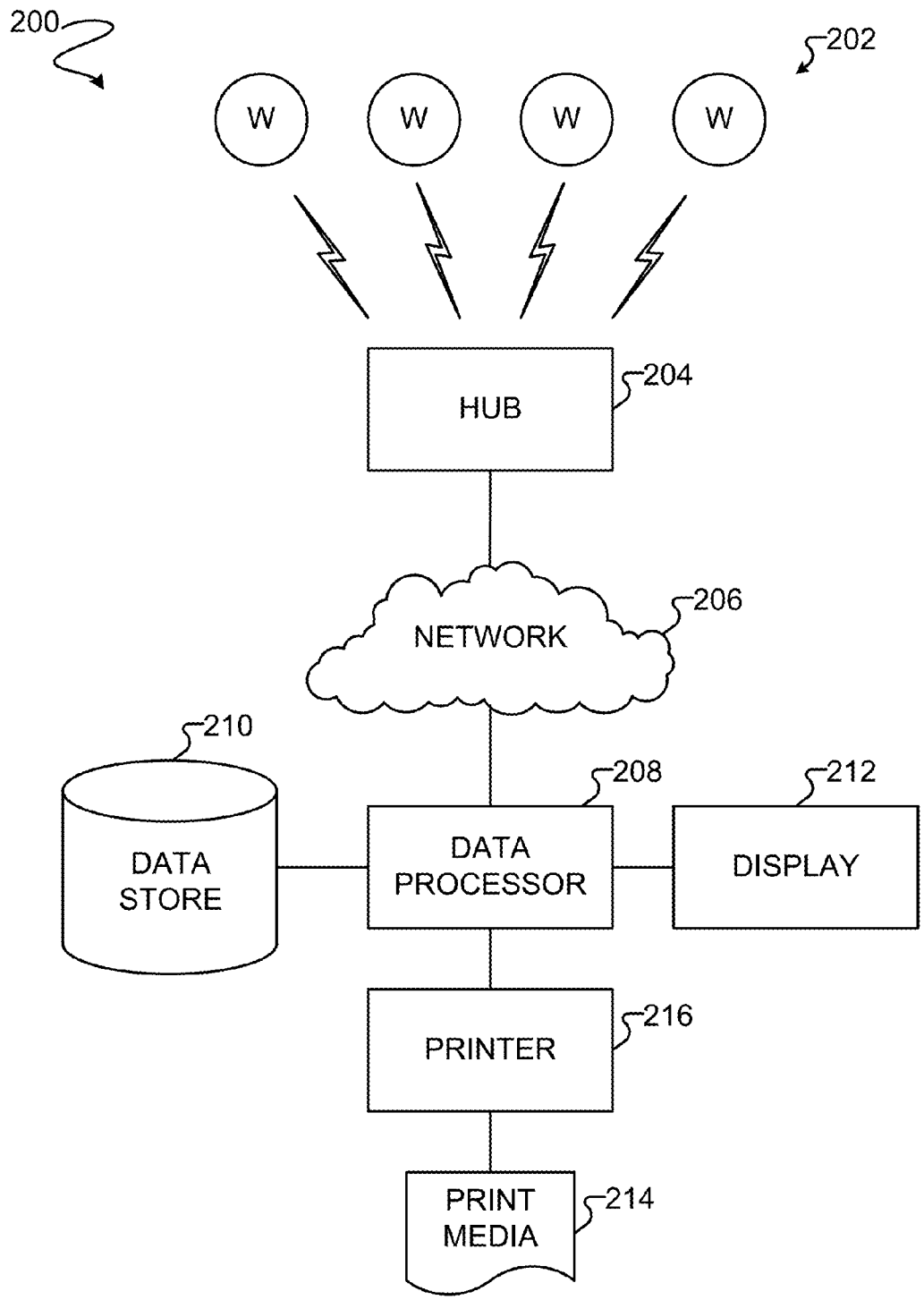
FIG. 6 is a schematic diagram of a system according to an example embodiment.

FIG. 6 is a schematic diagram of a system 200 according to an example embodiment. System 200 comprises a plurality of electric energy meters 202. Meters 202 are configured to obtain at least load profile data, and may be configured to obtain instantaneous real and reactive power data and instantaneous voltage data. Meters 202 include a plurality of consumer meters and at least one upstream meter (e.g., a distribution transformer meter) that meters energy delivered to a subset of at least two of the consumer meters (e.g., an inventory zone). Meters 202 are communicatively coupled to a hub 204. In the illustrated system, meters 202 are wireless networked with hub 204, but this is not necessary. Meters 202 may be communicatively coupled with each other (e.g., in a mesh network), or may have direct links to hub 204, for example. Hub 204 is configured to aggregate data obtained by meters 202.

Hub 204 is communicatively coupled via a communication network 206 to a data processor 208. Network 206 may comprise a public network (e.g., the Internet) or a private network (e.g., comprised of private communication links), and may be implemented using any suitable networking technology (e.g., packet based, switched link, etc.).

Data processor 208 may comprise one or more central processing units (CPUs), one or more microprocessors, one or more field programmable gate arrays (FPGAs), application specific integrated circuits, logic circuits, or any combination thereof, or any other suitable processing unit(s) comprising hardware and/or software capable of functioning as described herein. Data processor 208 is coupled to a data store 210. Data store 210 comprises one or more non-transitory computer readable media. Data processor 208 is configured to store data obtained by meters 202 and received at data processor 208 (e.g., via hub 204 and network 206) in data store 210.

Data processor 208 is also configured to execute one or more steps of methods 40, 50 and 120. For example, data processor may be configured to execute software instructions contained in a non-transitory computer-readable medium of data store 210, which instructions when executed by data processor 208 cause data processor 208 to perform one of more steps of methods 40, 50 and 120. Data processor 208 may be configured to cause output of methods 40, 50 and/or 120 (e.g., identification of nodes affected by tap diversions and/or bypass diversions, bypass loads and/or tap loads associated with nodes, customer billing information, etc.) to be displayed on a display 212, to printed on print media 214 by a printer 216, and/or to be stored as a record in non-transitory computer-readable media of data store 210, for example.

Data processor 208 may comprise physically remote and independently operating components, one of which stores data obtained by meters 202 in data store 210 and another that performs steps of methods 40, 50 and/or 120. Data store 210 may comprise physically remote and independently operating components, one of which stores data obtained by meters 202 and another that stores computer-readable instructions executable by data processor 208.

In some situations, it may be problematic to properly identify the locations of tap diversions in an inventory zone due to voltage measurement errors. For example, certain currently available consumer meters have a rated measurement error of about 0.5%. Some types of meters have typical measurement errors of about 0.2%. Accordingly, it is possible that in some circumstances method 50 described above may fail to converge on a solution. In such circumstances, a modified method may be performed to locate tap diversions wherein a "secondary tap" at one of a plurality of distribution nodes is considered, as discussed below with reference to FIGS. 7 and 8.

Figure 7:
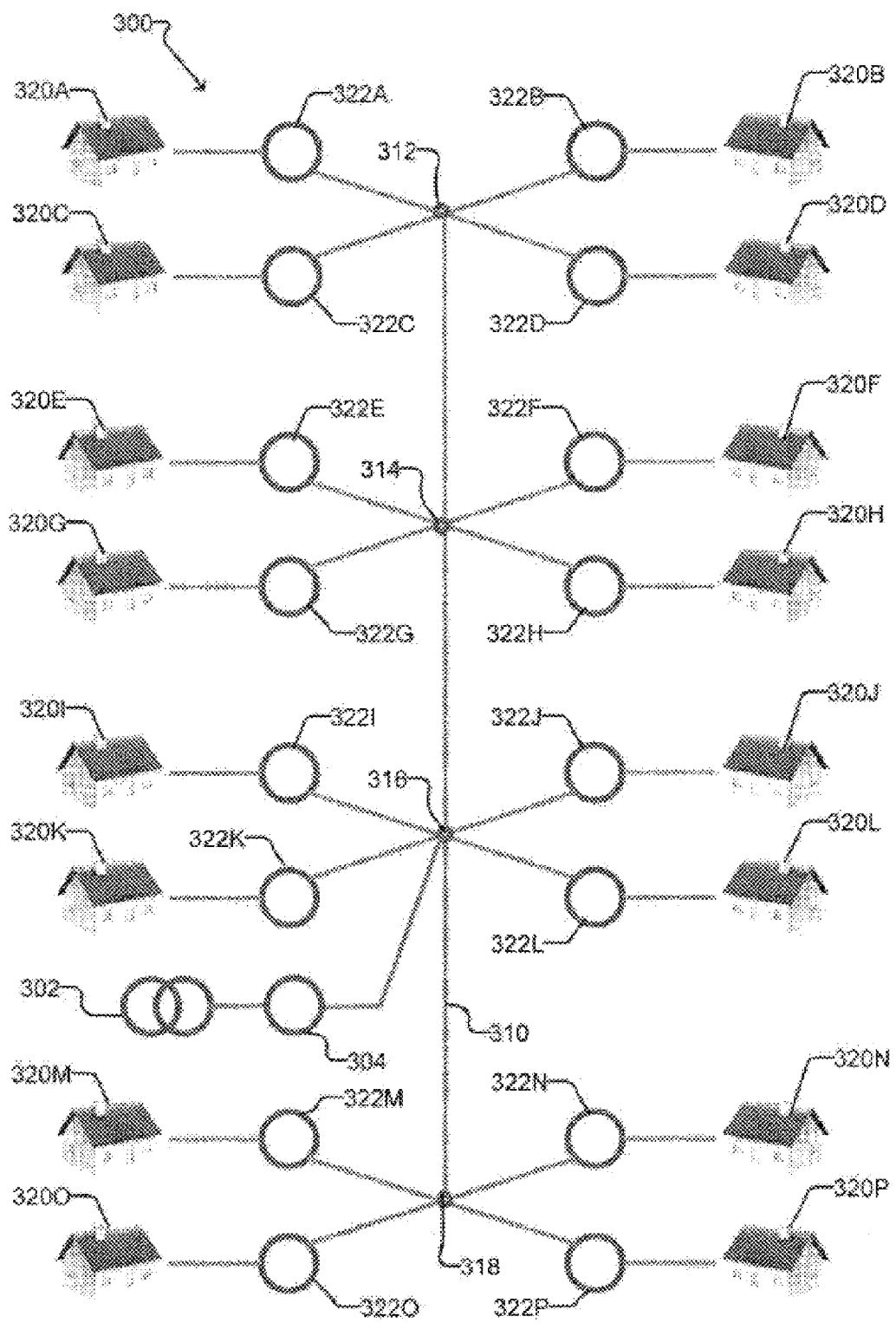
FIG. 7 is a schematic diagram of another example inventory zone, which is referred to in describing the example method illustrated by FIG. 8.

FIG. 7 shows an example inventory zone 300 wherein a distribution transformer 302 supplies sixteen consumers 320A-P. The total power delivered to inventory zone 300 by distribution transformer 302 is metered by a distribution meter 304. The power delivered to each of consumers 320A-P (other than any power which is unlawfully diverted) is respectively metered by consumer meters 322A-P. Consumers 320A-P are arranged into four groups connected (through their respective meters) to a secondary distribution line 310 at four separate distribution nodes 312, 314, 316, 318, with consumers 320A-D connected to node 312, consumers 320E-H connected to node 314, consumers 320I-L connected to node 316, and consumers 320M-P connected to node 318. Distribution transformer 302 is also connected (through distribution meter 304) to node 316.

Figure 8:
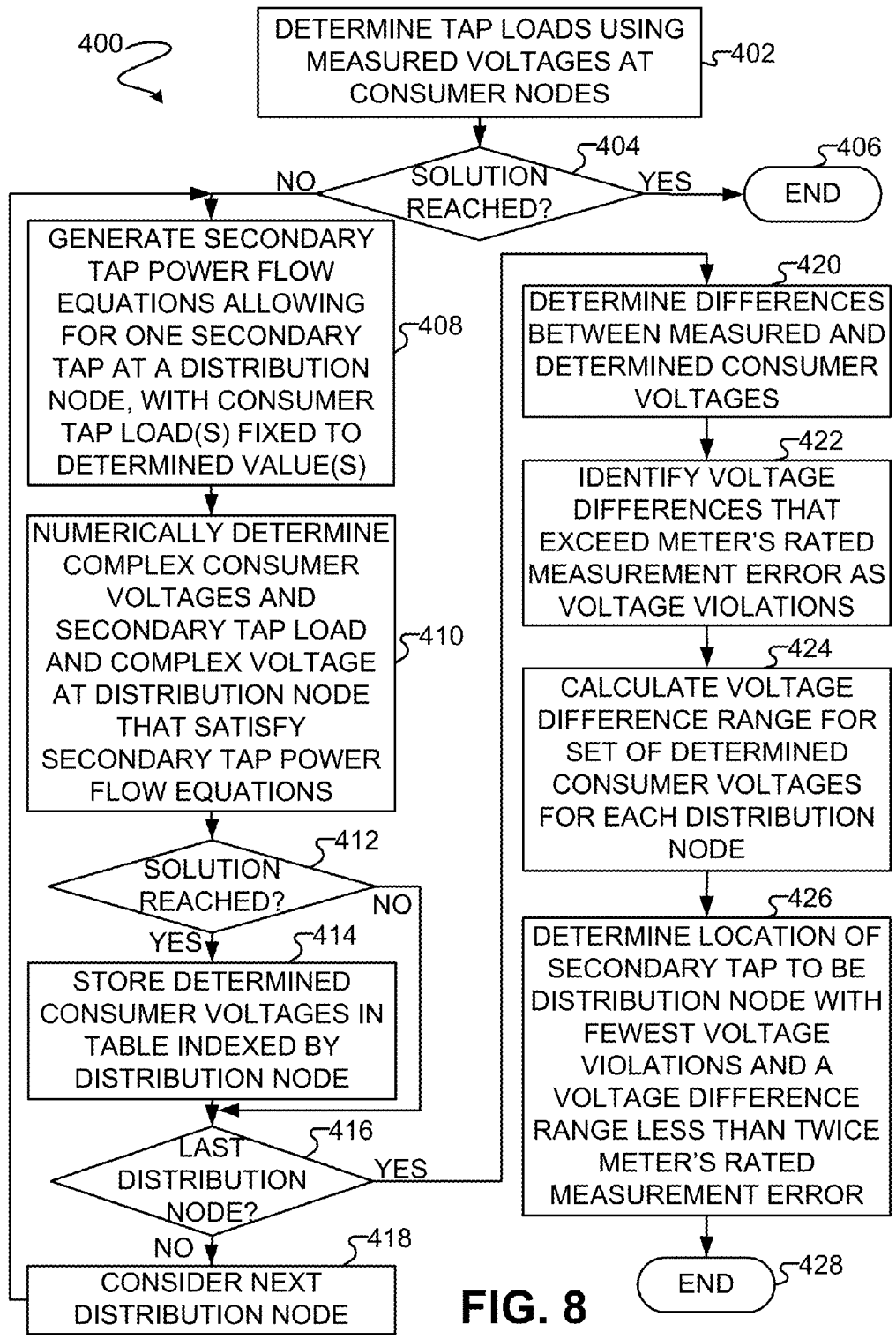
FIG. 8 is a flowchart of a method according to an example embodiment.

FIG. 8 illustrates an example method 400 for identifying locations of tap diversions in an inventory zone. Method 400 is described with reference to example inventory zone 300 of FIG. 7, but it is to be understood that method 400 could be useful for identifying locations of tap diversions in any inventory zone with two or more distribution nodes. Method 400 may, for example, be performed wholly or in part by one or more processing elements, such as for example data processor 208.

Step 402 comprises determining tap loads at consumer nodes using the measured loads and voltages at the consumer nodes. Step 402 may comprise one or more steps of method 50, for example. If a solution is reached at step 404, method 400 proceeds to end at step 406. If a solution is not reached at step 404, method 400 proceeds to step 408. A solution may not be reached, for example, if the determination at step 402 fails to converge (e.g., the error terms are not less than a predetermined convergence threshold). However, even if the determination at step 402 fails to converge, it will identify consumers where tap diversions are likely. Accordingly, the results of the determination at step 402 are used in step 408.

In step 408 a set of secondary tap power flow equations are generated which allow for a tap at one of the secondary distribution nodes by assigning the real and reactive tap loads and the voltage magnitude and phase at the secondary distribution node as unknown variables to determine. The consumer tap loads are fixed to the values determined in step 402, and the consumer voltage magnitudes and phases are also unknown variables to determine. The secondary tap power flow equations may have the same general form as equations (5) and (6) above. For example, in some embodiments step 408 may comprise taking the results from step 402 and changing which values are fixed and which values are variable to generate the secondary tap power flow equations.

In step 410, real and reactive tap loads and the voltage magnitude and phase at the secondary distribution node under consideration, as well as consumer voltage magnitudes and phases, that satisfy the secondary tap power flow equations are numerically determined (e.g., by a Generalized Reduced Gradient method as discussed above). If a solution is reached at step 412 (e.g. the solution converges), method 400 proceeds to step 414 and the calculated consumer voltage magnitudes are stored in a table indexed by the secondary distribution node (or another suitable data structure). Step 414 may also comprise storing complex consumer voltages, consumer tap magnitudes and/or secondary tap magnitudes. For example, consumer and secondary tap magnitudes may optionally be used to validate the results of method 400 by comparing the total loss measured for inventory zone 300 to the sum of the taps calculated by method 400 (with appropriate adjustments for any bypasses, as discussed above). If a solution is not reached at step 412, method 400 bypasses step 414 (such that the voltages are not stored) and proceeds to step 416.

At step 416, if the secondary distribution node under consideration is not the last distribution node (i.e., if all secondary distribution nodes have not yet been considered), method 400 proceeds to step 418 where a next distribution node is considered. After step 418, method 400 repeats steps 408 to 416 until the last distribution node has been considered.

After all of the distribution nodes have been considered (step 416, YES), method 400 proceeds to step 420, where differences between the measured voltages and the calculated consumer voltage magnitudes stored in step 414 are determined for each distribution node. At step 422, any voltage difference that exceeds the respective meter's rated measurement error is identified as a voltage violation. At step 424, a voltage difference range is calculated for each distribution node by determining the "spread" in voltage differences. In other words, the voltage difference range for a distribution node is the range between the highest positive voltage difference determined in step 420 and the lowest negative voltage difference determined in step 420.

At step 426, the secondary distribution node(s) having the smallest voltage difference range (in no case more than twice the meters' rated measurement error) and the fewest voltage violations determined at step 422 is determined to be a likely location of a secondary distribution system tap. If one of the secondary distribution nodes has a voltage difference range of less than twice the meters' rated measurement error, or has a significantly lower voltage difference range than the other secondary distribution nodes, then that secondary distribution node is determined to be the most likely location of a secondary tap. In some situations, more than one secondary distribution node may be determined to be a likely tap location. For example, with reference to FIG. 3, in the situation of a secondary tap on distribution line 310 between nodes 312 and 314, the voltage difference ranges and number of voltage violations calculated for nodes 312 and 314 may be similar. In order to more precisely determine the likely location of the secondary tap, in some embodiments step 426 comprises determining and comparing cumulative voltage differences between the measured voltages and calculated voltages for each secondary distribution node stored in step 414. The cumulative voltage difference for each secondary distribution node is the sum of the differences between the measured consumer voltages and the consumer voltages calculated when allowing for a tap at that node. In one example, when a secondary tap is between secondary distribution nodes 312 and 314, the cumulative voltage difference when allowing for a tap at node 312 indicates that the calculated voltages tend to be lower than the measured voltages, and the cumulative voltage difference when allowing for a tap at node 314 indicates that the calculated voltages tend to be higher than the measured voltages, and the ratio of cumulative voltage differences (or another suitable relationship between the voltage differences when allowing for a tap a node 312 and the voltage differences when allowing for a tap at node 314) may be used to determine the most likely location of a secondary tap along distribution line 310 between nodes 312 and 314.

The location of the secondary tap determined at step 426 may be output by any suitable means, including those described above with respect to system 200 of FIG. 6. After step 426, method 400 ends at step 428.

Figure 9:
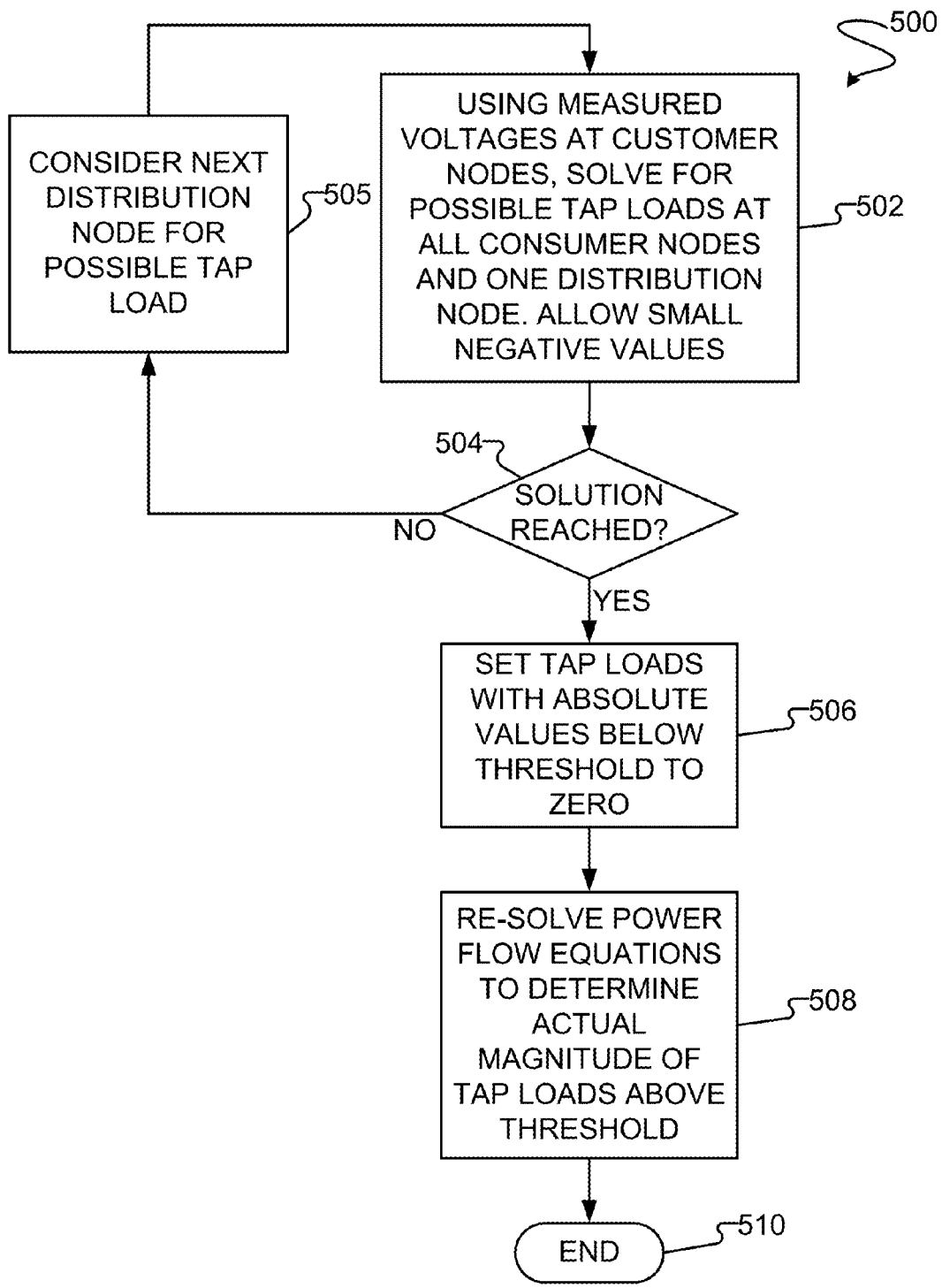
FIG. 9 is a flowchart of a method according to an example embodiment.

FIG. 9 illustrates an example method 500 for identifying locations of tap diversions in an inventory zone. Method 500 could be useful for identifying locations of tap diversions in at one or more consumer nodes and a distribution node in an inventory zone. Method 500 may, for example, be performed wholly or in part by one or more processing elements, such as for example data processor 208. Step 502 comprises attempting to solve the power flow equations for possible tap loads at one distribution node and all consumer nodes using the measured loads and voltages at the consumer nodes, and allowing for small negative values (e.g., with an absolute value less than would result from an expected measurement error). Step 502 may comprise one or more steps of method 50, for example. If a solution is not reached at step 504, method 500 proceeds to step 505, where a next one of the distribution nodes is selected for consideration, then returns to step 502 to attempt to solve the power flow equations allowing for a tap load at that distribution node under consideration. A solution may not be reached, for example, if the determination of tap loads at step 502 fails to converge (e.g., the error terms are not less than a predetermined convergence threshold). Once a solution is reached at step 504, if there is a tap load present at a distribution node it is identified as being at the distribution node under consideration, and method 500 proceeds to step 506.

At step 506, for any nodes which the solution assigned a "small" tap load having an absolute value less than a threshold (e.g., less than would result from an expected measurement error), those small tap loads are set to zero. At step 508, the power flow equations are solved again, with the small tap loads identified in step 506 set to zero and allowing the voltages of the nodes to float, thereby determining the actual magnitudes of any tap loads and the node voltages. After step 508, the magnitude and location of the determined tap loads are identified, allowing the grid operators to take appropriate measures such as for example those described above with reference to method 120 of FIG. 5, and then method 500 ends at step 510.

It will be appreciated from the foregoing that determining the presence and identifying the locations of bypass and tap diversions is an undertaking whose complexity expands dramatically with the number of nodes in an inventory zone. For inventory zones of even a few meters, the numerical solution methods required to perform the methods disclosed herein cannot, as a practical matter, be performed entirely in a human's mind and accordingly requires use of a machine configured to perform such methods.

Where a component or feature is referred to above (e.g., meter, transformer, inventory zone, load profile data, interval data, data processor, data store, hub, printer, display, etc.), unless otherwise indicated, reference to that component (including a reference to a "means") should be interpreted as including as equivalents of that component any component which performs the function of the described component (i.e., that is functionally equivalent), including components which are not structurally equivalent to the disclosed structure which performs the function in the illustrated exemplary embodiments of the invention.

Unless the context clearly requires otherwise, throughout the description and the claims, the words "comprise," "comprising," and the like are to be construed in an inclusive sense, as opposed to an exclusive or exhaustive sense; that is to say, in the sense of "including, but not limited to." Where the context permits, words in the above description using the singular or plural number may also include the plural or singular number respectively. The word "or," in reference to a list of two or more items, covers all of the following interpretations of the word: any of the items in the list, all of the items in the list, and any combination of the items in the list.

The above detailed description of example embodiments is not intended to be exhaustive or to limit this disclosure and claims to the precise forms disclosed above. Those skilled in the art will appreciate that certain features of embodiments described herein may be used in combination with features of other embodiments described herein, and that embodiments described herein may be practiced or implemented without all of the features ascribed to them herein, as would be apparent to the skilled addressee. While specific examples of, and examples for, embodiments are described above for illustrative purposes, various equivalent modifications are possible within the scope of the technology, including variations comprising mixing and matching of features from different embodiments, as those skilled in the relevant art will recognize.

These and other changes can be made to the system in light of the above description. While the above description describes certain examples of the technology, and describes the best mode currently contemplated, no matter how detailed the above appears in text, the technology can be practiced in many ways. As noted above, particular terminology used when describing certain features or aspects of the system should not be taken to imply that the terminology is being redefined herein to be restricted to any specific characteristics, features, or aspects of the system with which that terminology is associated. In general, the terms used in the following claims should not be construed to limit the system to the specific examples disclosed in the specification, unless the above description section explicitly and restrictively defines such terms. Accordingly, the actual scope of the technology encompasses not only the disclosed examples, but also all equivalent ways of practicing or implementing the technology under the claims.

As will be apparent to those skilled in the art in light of the foregoing disclosure, many alterations and modifications are possible to the methods and systems described herein. For example:

Methods described herein may be applied to electric distribution systems having topologies different from those of the example systems shown herein.

Inventory zones may be defined between feeder meters. For one example, the difference between metered readings of upstream and downstream feeder meters may be treated as readings for an inventory zone that draws electric energy from between the feeder meters. For another example, a meter reading of an upstream feeder meter may be treated as a reading for an inventory zone, and a downstream feeder meter treated as a consumer node in the inventory zone. An inventory zone defined between by feeder meters may comprise a plurality of transformers, each of which supplies electric energy to a plurality of consumer nodes.

Measured load profile and energy consumption data (e.g, obtained from meters) may be pre-conditioned prior to being used in methods described herein. For example, data may be modified to eliminate anomalies revealed by simple inspection of data, such as meter inversions and meter removals.

Distribution taps may be identified or accounted by inserting dummy nodes having no "known" (e.g., metered) load or consumption at appropriate locations in a network topology, and performing methods described herein on the topology including the dummy nodes.

Methods and techniques described herein may be modified to account for technical losses. A non-limiting example of such a modification can be posited for the case where feeder meters are used to determine energy consumption for an inventory zone is located close to a head-end substation. In this case, the load(s) downstream from the inventory zone may be large enough to cause non-trivial technical losses inside the inventory zone, which could be mistaken for non-technical losses (e.g., theft). A dummy load equal the expected technical losses (e.g., as calculated based on downstream load and distribution line impedance) may be added to the inventory zone to account for the technical losses.

Methods and techniques described herein may be adapted for use with distribution of fluid commodities by analogizing properties of electric energy distribution to properties of fluids. For example, some methods and techniques described herein may be adapted to detect water and natural gas theft by analogizing consumption to volume, load to flow and voltage to pressure.

While a number of exemplary aspects and embodiments have been discussed above, those of skill in the art will recognize certain modifications, permutations, additions and sub-combinations thereof. It is therefore intended that the following appended claims and claims hereafter introduced are interpreted to include all such modifications, permutations, additions and sub-combinations as are may reasonably be inferred by one skilled in the art. The scope of the claims should not be limited by the embodiments set forth in the examples, but should be given the broadest interpretation consistent with the foregoing disclosure.

What is claimed is:

1. A method for identifying and locating non-technical losses in an electric utility power distribution inventory zone, the inventory zone comprising a plurality of nodes including at least one metered distribution node and at least two metered consumer nodes, the method comprising:
    obtaining inventory zone load profile data;
    obtaining consumer load profile data for the consumer nodes;
    determining bypass diversion factors for the consumer nodes and aggregate tap loads for the inventory zone that:
        solve a system of load balance equations for the inventory zone having known values corresponding to the inventory zone load profile data and to the consumer load profile data and having slack variables representing the aggregate tap loads, in which the known values corresponding to the consumer load profile data are scaled by the bypass diversion factors; and
        minimize an objective function whose value is positively related to the sum of the slack variables representing the aggregate tap loads;
    identifying a bypass diversion factor of at least two as a bypass theft and locating the bypass theft based on a location of the consumer node corresponding to that bypass diversion factor; and,
    cutting power to the consumer node corresponding to the bypass theft.

2. The method of claim 1 comprising constraining the variables in the system of load balance equations corresponding to the bypass diversion factors to be greater than a pre-determined threshold value.

3. The method of claim 1 wherein the variables in the system of load balance equations corresponding to the aggregate tap loads are constrained to be at least a small negative number selected based on an expected maximum measurement error.

4. The method of claim 3 comprising zeroing out any slack variable having an absolute value of less than the expected maximum measurement error.

5. The method of claim 1 wherein obtaining inventory zone load profile data and obtaining consumer load profile data comprises obtaining interval data for a plurality of intervals that span a time period including a tap load transition.

6. The method of claim 1 comprising obtaining consumer load profile data for at least one metered consumer node having unknown connectivity to the inventory zone, including the consumer load profile data for the at least one metered consumer node having unknown connectivity to the inventory zone in the load balance equations, and determining a connectivity of the at least one metered consumer node having unknown connectivity to the inventory zone based on the bypass diversion factor for the at least one metered consumer node having unknown connectivity to the inventory zone, wherein a bypass diversion factor of 0 indicates that the at least one metered consumer node having unknown connectivity to the inventory zone is not connected to the inventory zone.

7. The method of claim 1 wherein determining bypass diversion factors for the consumer nodes and aggregate tap loads for the inventory zone comprises including known unmetered loads in the system of load balance equations by synthesizing load profile data for one or more constant loads, one or more switched loads, and technical losses, and determining multipliers for constant loads, switched loads, and technical losses.

8. The method of claim 1 wherein the inventory zone comprises one or more unmetered nodes, and wherein in the first system of power flow equations voltage magnitude and phase angles for the unmetered nodes are treated as unknowns and wherein real and reactive power for the unmetered nodes are fixed to arbitrary values.

9. The method of claim 8 wherein in the second system of power flow equations voltage magnitude and tap affected phase angles for the unmetered nodes are treated as unknowns.

10. A method for identifying and locating tap loads in an electric utility power distribution inventory zone, the inventory zone comprising a plurality of nodes including a metered distribution node and at least two metered consumer nodes, the method comprising:
    obtaining an admittance matrix modeling the electrical admittance between the nodes of the inventory zone;
    obtaining real and reactive load data for each of the metered nodes of the inventory zone;
    obtaining voltage magnitude data for each of the metered nodes of the inventory zone;
    determining a voltage phase angle for each of the consumer nodes that solve a first system of power flow equations for the inventory zone having known values corresponding to the real and reactive load data for the consumer nodes and in which the distribution node is treated as a slack node;
    determining real and reactive unmetered tap loads corresponding to select ones of the consumer nodes that:
    solve a second system of power flow equations for the inventory zone having known values corresponding to the real and reactive load data for each of the nodes, voltage magnitude values corresponding to the voltage data for each of the metered nodes, and having slack variables representing the real and reactive unmetered tap loads, and
    minimize an objective function whose value is positively related to at least one of the slack variables representing the real and reactive unmetered tap loads using an iterative numerical solution technique wherein variables in the second system of power flow equations corresponding to the voltage phase angles of the select ones of the consumer nodes are initialized to values corresponding to the corresponding determined voltage phase angles that solve the first system of power flow equations;

identifying any of the real and reactive unmetered tap loads having a value exceeding a pre-determined threshold as a tap theft and locating the tap theft based on a location of the corresponding consumer node; and, cutting power to the consumer node corresponding to the tap theft.

11. The method of claim 10 wherein in the first system of power flow equations variables corresponding to the voltage magnitudes of the consumer nodes are initialized to values corresponding to the instantaneous voltage magnitude data obtained for the distribution node.

12. The method of claim 11 wherein in the first system of power flow equations a term corresponding to a voltage magnitude of the distribution node is fixed to equal a value corresponding to the instantaneous voltage magnitude data obtained for the distribution node.

13. The method of claim 12 wherein in each of the first system of power flow equations and the second system of power flow equations a term corresponding to a voltage phase angle of the distribution node is fixed to equal zero.

14. The method of claim 10 wherein in the second system of power flow equations variables corresponding to the real and reactive tap loads of a consumer node are further constrained by a pre-determined relationship with one another.

15. The method of claim 14 wherein the pre-determined relationship comprises a linear relationship.

16. The method of claim 14 wherein the pre-determined relationship specifies that the reactive tap load is equal to the product of the real tap load and a scale factor.

17. The method of claim 16 wherein the scale factor is less than or equal to 0.2.

18. The method of claim 16 comprising determining the scale factor by:
   determining a real component of aggregate tap power based on a difference between a real power value for the distribution node that solves the first system of power flow equations and a real power value for the distribution node corresponding to the obtained instantaneous real load data for the distribution node;
   determining a reactive component of aggregate tap power based on a difference between a reactive power value for the distribution node that solves the first system of power flow equations and a reactive power value for the distribution node corresponding to the obtained instantaneous reactive load data for the distribution node; and
   determining the scale factor as an aggregate tap power factor based on the real and reactive components of aggregate tap power.

19. The method of claim 10 wherein in the second system of power flow equations variables corresponding to the real and reactive tap loads of a consumer node are further constrained to be at least a small negative number selected based on an expected maximum measurement error.

20. The method of claim 10 wherein the inventory zone comprises two or more secondary distribution nodes to which metered consumer nodes are connected, comprising, when the iterative numerical solution technique fails to converge:
   for each secondary distribution node:
      determining calculated complex consumer voltages and real and reactive secondary tap loads corresponding to that secondary node that solve a third system of power flow equations for the inventory zone which allow for a secondary tap at that secondary distribution node having fixed values corresponding to the real and reactive tap loads determined for the consumer nodes, and having slack variables representing calculated consumer voltages and real and reactive secondary tap loads, and minimize an objective function whose value is positively related to at least one of the slack variables representing the calculated consumer voltages and real and reactive secondary tap loads using an iterative numerical solution technique; and,
      when the iterative numerical solution technique converges to a solution, storing calculated voltage magnitudes corresponding to the calculated complex consumer voltages in a data structure indexed by secondary distribution node,
   determining a voltage difference between each of the voltage magnitudes corresponding to the calculated complex consumer voltages stored in the data structure indexed by secondary distribution node and the voltage magnitude values corresponding to the voltage data for each of the metered consumer nodes;
   identifying each voltage difference which exceeds a rated measurement error of the corresponding meter as a voltage violation;
   determining a voltage difference range for each secondary distribution node having voltage magnitudes corresponding to the calculated complex consumer voltages stored in the data structure; and
   determining a secondary tap location based on the voltage difference range and number voltage violations for each secondary distribution node.

21. The method of claim 20 wherein determining the secondary tap location comprises identifying the secondary distribution node whose voltage difference is less than twice the rated measurement error and having the fewest voltage violations as the secondary tap location.

22. The method of claim 21 wherein determining the secondary tap location comprises identifying two secondary distribution nodes whose voltage differences are less than twice the rated measurement error and having relatively low numbers of voltage violations, and determining the secondary tap location to be between the identified two secondary distribution nodes.

23. The method of claim 22 comprising determining a cumulative voltage difference for each of the identified two secondary distribution nodes and further narrowing the secondary tap location based on a relation between the cumulative voltage differences.

24. The method of claim 10 wherein obtaining the real and reactive load data for the consumer nodes comprises obtaining at least one measurement corresponding to one of the consumer nodes and multiplying the measurement by a bypass diversion factor corresponding to that consumer node.

25. A system for identifying and locating tap loads in an electric utility power distribution inventory zone, the inventory zone comprising a plurality of nodes including at least one metered distribution node and at least two metered consumer nodes, the system comprising:
   a data store comprising a non-transitory computer readable medium containing an admittance matrix modeling the electrical admittance between the nodes of the inventory zone, real and reactive load data for each of the metered nodes of the inventory zone, and voltage magnitude data for each of the metered nodes of the inventory zone; and
   a data processor communicatively coupled to the data store and configured to:

obtain the admittance matrix from the data store;
obtain the real and reactive load data from the data store;
obtain the voltage magnitude data from the data store;
determine a voltage phase angle for each of the consumer nodes that solve a first system of power flow equations for the inventory zone having known values corresponding to the real and reactive load data for the consumer nodes and in which the distribution node is treated as a slack node;
determine real and reactive unmetered tap loads corresponding to select ones of the consumer nodes that:
solve a second system of power flow equations for the inventory zone having known values corresponding to the real and reactive load data for each of the nodes, voltage magnitude values corresponding to the voltage data for each of the metered nodes, and having slack variables representing the real and reactive unmetered tap loads, and
minimize an objective function whose value is positively related to at least one of the slack variables representing the real and reactive unmetered tap loads using an iterative numerical solution technique wherein variables in the second system of power flow equations corresponding to the voltage phase angles of the select ones of the consumer nodes are initialized to values corresponding to the corresponding determined voltage phase angles that solve the first system of power flow equations;
identify any of the real and reactive unmetered tap loads having a value exceeding a pre-determined threshold as a tap theft and locate the tap theft based on a location of the corresponding consumer node; and,
cut power to the consumer node corresponding to the tap theft.

* * * * *